(12) United States Patent
Ogaki et al.

(10) Patent No.: US 11,368,094 B2
(45) Date of Patent: Jun. 21, 2022

(54) CONTROL SYSTEM AND POWER SUPPLY UNIT

(71) Applicant: OMRON Corporation, Kyoto (JP)

(72) Inventors: Tatsuo Ogaki, Kusatsu (JP); Seiji Oka, Ibaraki (JP); Kenji Komatsubara, Ritto (JP)

(73) Assignee: OMRON Corporation, Kyoto (JP)

( * ) Notice: Subject to any disclaimer, the term of this patent is extended or adjusted under 35 U.S.C. 154(b) by 148 days.

(21) Appl. No.: 17/043,718

(22) PCT Filed: Apr. 22, 2019

(86) PCT No.: PCT/JP2019/016990
§ 371 (c)(1),
(2) Date: Sep. 30, 2020

(87) PCT Pub. No.: WO2019/225253
PCT Pub. Date: Nov. 28, 2019

(65) Prior Publication Data
US 2021/0028707 A1 Jan. 28, 2021

(30) Foreign Application Priority Data
May 21, 2018 (JP) .............................. JP2018-096951

(51) Int. Cl.
*H02M 7/529* (2006.01)
*H02M 3/157* (2006.01)
(Continued)

(52) U.S. Cl.
CPC .............. *H02M 3/335* (2013.01); *H03K 5/24* (2013.01); *H02M 1/0012* (2021.05);
(Continued)

(58) Field of Classification Search
CPC .... H02M 1/0012; H02M 3/157; H02M 3/335; H02M 3/33507; H02M 3/33515; H02M 7/529; H02M 7/53875
See application file for complete search history.

(56) References Cited

U.S. PATENT DOCUMENTS

2008/0086659 A1 4/2008 Ishikawa et al.
2010/0241879 A1* 9/2010 Hara ................. H02M 3/33515
713/300

(Continued)

FOREIGN PATENT DOCUMENTS

JP 2003005872 1/2003
JP 2008097068 4/2008

(Continued)

OTHER PUBLICATIONS

"International Search Report (Form PCT/ISA/210) of PCT/JP2019/016990," dated Jul. 2, 2019, with English translation thereof, pp. 1-2.

(Continued)

*Primary Examiner* — Gary A Nash
(74) *Attorney, Agent, or Firm* — JCIPRNET

(57) ABSTRACT

This power supply unit of a control system outputs a notification signal to a calculation unit when a time in which an input voltage becomes smaller than a threshold voltage exceeds a prescribed first measurement time. When detecting that a predetermined second measurement time has elapsed after the notification signal has been received, the calculation unit outputs an instruction signal instructing the execution of a process before a stop in preparation for a prescribed stop of power supply, and executes the process before the stop in place of the current process. Settings of the (Continued)

threshold voltage and the second measurement time are configured to be changeable by means of an external operation.

14 Claims, 9 Drawing Sheets

(51) Int. Cl.
  *H02M 3/335* (2006.01)
  *H03K 5/24* (2006.01)
  *H02M 1/00* (2006.01)

(52) U.S. Cl.
  CPC ........ *H02M 3/157* (2013.01); *H02M 3/33515* (2013.01); *H02M 7/529* (2013.01)

(56) References Cited

U.S. PATENT DOCUMENTS

| | | | |
|---|---|---|---|
| 2011/0078481 A1 | 3/2011 | Noda | |
| 2013/0278059 A1* | 10/2013 | Liu | H02M 3/158 307/31 |
| 2014/0077781 A1* | 3/2014 | Murakami | H02M 3/157 323/282 |
| 2015/0224946 A1 | 8/2015 | Sato et al. | |

FOREIGN PATENT DOCUMENTS

| | | |
|---|---|---|
| JP | 2014090624 | 5/2014 |
| WO | 2005088819 | 9/2005 |

OTHER PUBLICATIONS

"Written Opinion of the International Searching Authority (Form PCT/ISA/237) of PCT/JP2019/016990," dated Jul. 2, 2019, with English translation thereof, pp. 1-6.

"Search Report of Europe Counterpart Application", dated Feb. 10, 2022, p. 1-p. 8.

"Office Action of Japan Counterpart Application" with English translation thereof, dated Aug. 24, 2021, p. 1-p. 6.

* cited by examiner

CONTROL SYSTEM AND POWER SUPPLY UNIT

CROSS-REFERENCE TO RELATED APPLICATION

This application is a 371 application of the International PCT application serial no. PCT/JP2019/016990, filed on Apr. 22, 2019, which claims the priority benefit of Japanese Patent Application No. 2018-096951, filed on May 21, 2018. The entirety of each of the above-mentioned patent applications is hereby incorporated by reference herein and made a part of this specification.

BACKGROUND

Technical Field

The present disclosure relates to a control system and, more particularly, relates to a process corresponding to stopping of supply of electric power.

Description of Related Art

In production sites using factory automation (FA), industrial control systems such as a programmable logic controller (PLC), a robot controller, and the like have been introduced. A control system can automate a production process by controlling various industrial drive devices that can perform communication using a network. Relating to such a control system, in PCT Publication WO 2005/088819 (Patent Literature 1), a configuration in which a voltage level between AC input terminals is detected at the time of interrupting an AC input of a switching power supply device, and an oscillation operation of a primary control circuit is stopped when the detected voltage level becomes equal to or lower than a predetermined level has been disclosed.

SUMMARY

Technical Problem

In a case in which it is determined whether or not power supply has been stopped using an input voltage, a conventional control system compares a voltage value set in advance as a threshold voltage with an input voltage. For this reason, in a production site on which an input voltage frequently changes or the like, in a case in which a threshold voltage is set to be higher than a general value, a frequency at which a control system determines that power supply has been stopped and ends the operation of the system becomes high, and the operation rate of the system becomes low. In addition, in a case in which the threshold voltage is set to be lower than a general value, a frequency at which the control system determines that power supply has been stopped and ends execution of the system becomes low. However, a voltage charged into a capacitor of a control system based on an input voltage becomes lower than that at the time when the threshold voltage has a general value, and an execution time of pre-stop processing in preparation for stop of power supply becomes short, and there are cases in which the operation of the system cannot be appropriately ended. Therefore, a technology enabling determination of stop of supply of power to a control system to be performed at an appropriate timing and securement of an execution time of pre-stop processing is required.

According to an embodiment of the present disclosure, a technology enabling determination of stop of supply of power to be performed at an appropriate timing and securement of an execution time of pre-stop processing is provided.

Solution to Problem

A control system according to an embodiment of the present disclosure includes: a calculation unit that executes an arithmetic operation process; and a power supply unit that supplies power to the calculation unit. The power supply unit includes: a power converting unit that charges a part of an input power input from the outside for charging and converts a remainder of the input power into power supplied to the calculation unit; and a first detection unit that compares a voltage of the input power with a threshold voltage and outputs a notification signal for notifying that predetermined power supply is not able to be performed in a case in which a time, over which a magnitude of the voltage has been lower than the threshold voltage, is detected to be over a first measurement time set in advance, the first detection unit is able to change a setting of the threshold voltage by an external operation. The calculation unit includes: a second detection unit that outputs an instruction signal for an instruction for execution of pre-stop processing in preparation for stopping of the predetermined power supply in a case in which it is detected that a second measurement time set in advance has elapsed after receiving the notification signal; and a processing execution management unit that continues execution of the arithmetic operation process during the second measurement time and execute the pre-stop processing in place of the arithmetic operation process that is currently being executed after receiving the instruction signal, the second detection unit being configured to be able to change a setting of the second measurement time by an external operation.

According to this configuration, by changing the threshold voltage and the adjustment time, the control system can decrease a frequency at which the operation of the system ends due to stopping of supply of power, and an execution time of pre-stop processing in preparation for stopping of supply of power can be reliably secured.

The control system may further include a third detection unit that outputs a stop instruction signal in a case in which a third measurement time for ending the arithmetic operation process using the calculation unit has elapsed.

According to this configuration, the control system can end the operation of the system at an appropriate timing according to a remaining power after stop of the supply of power.

A switch that is able to change the setting of the threshold voltage by the external operation may be disposed on a surface of the power supply unit.

According to this configuration, the control system can easily receive a change of the threshold voltage by a user's manual operation.

In the first detection unit, the threshold voltage is changed to a voltage lower than a voltage that has been set at a previous time in a case in which the second measurement time is changed to a time shorter than a time that has been set at the previous time, and the threshold voltage is changed to a voltage higher than a voltage that has been set at a previous time in a case in which the second measurement time is changed to a time longer than a time that has been set at the previous time.

According to this configuration, the control system can adjust a frequency at which it is determined that the supply of power is to be stopped by the form of the system, and a necessary process after the determination of stop of the supply of power can be reliably executed.

In the second detection unit, the second measurement time may be changed to a time shorter than a time that has been set at a previous time in a case in which the threshold voltage is changed to a voltage lower than a voltage that has been set at the previous time, and the second measurement time may be changed to a time longer than a time that has been set at a previous time in a case in which the threshold voltage is changed to a voltage higher than a voltage that has been set at the previous time.

According to this configuration, the control system can change a time of a second timer in association with a change of the threshold voltage, and user convenience at the time of changing the settings is improved.

The control system may further include a support device configured to be electrically connected to the calculation unit. The support device includes: a calculation part that calculates the threshold voltage corresponding to the second measurement time; and a display part that displays information relating to the threshold voltage.

According to this configuration, the control system can display the threshold voltage on the display and can receive a change of the setting from a user who has checked the threshold voltage displayed on the display.

According to a yet another embodiment of the present disclosure, a power supply unit that supplies power to a calculation unit executing an arithmetic operation process is provided. The power supply unit includes: a power converting unit that changes a part of an input power input from the outside and converts a remainder of the input power into power supplied to the calculation unit; and a first detection unit that compares a voltage of the input power with a threshold voltage and outputs a notification signal for notifying that predetermined power supply is not able to be performed in a case in which a time, over which a magnitude of the voltage has been lower than the threshold voltage, is detected to be over a first measurement time set in advance. The calculation unit receives the notification signal from the first detection unit, issues an execution signal for executing pre-stop processing in preparation for stopping of the predetermined power supply when a second measurement time set in advance has elapsed, continues to execute the arithmetic operation process during the second measurement time, executes the pre-stop processing in place of the arithmetic operation process that is currently being executed after the execution signal is received, and is able to change a setting of the second measurement time by an external operation. The first detection unit is able to change the setting of the threshold voltage by an external operation.

According to this configuration, by changing the threshold voltage and the adjustment time, the power supply unit can decrease a frequency at which the operation of the system ends due to stopping of supply of power, and an execution time of pre-stop processing in preparation for stopping of supply of power can be reliably secured.

Effects

According to an embodiment of the present disclosure, determination of stop of supply of power can be performed at an appropriate timing, and an execution time of pre-stop processing can be secured.

DESCRIPTION OF EMBODIMENTS

Hereinafter, an embodiment of the present disclosure will be described with reference to the drawings. In the following description, the same reference signs will be assigned to components which are the same. In addition, names and functions thereof are the same. Thus, detailed description thereof will not be repeated.

<Example of Configuration of PLC System>

Figure 1:
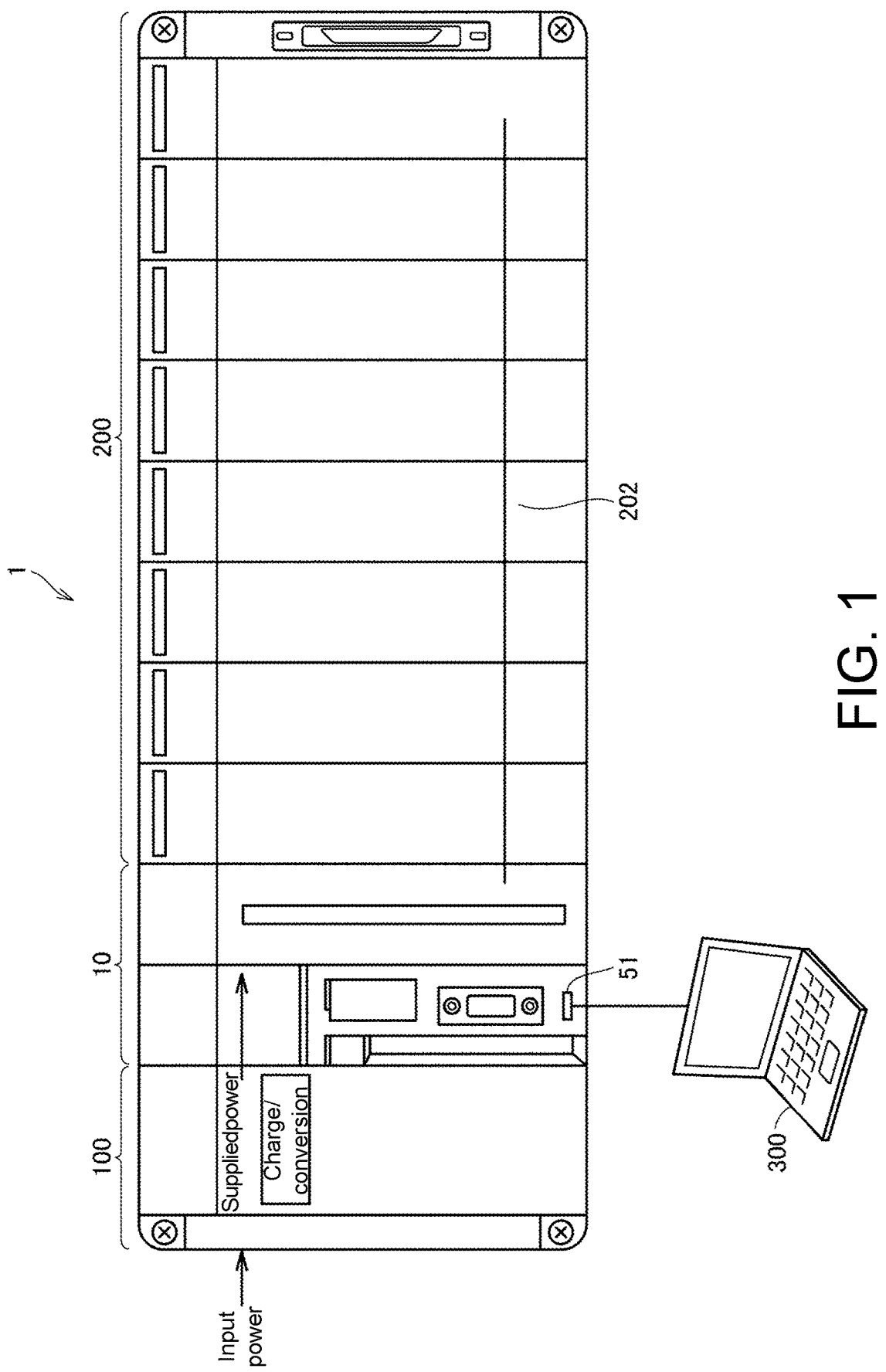
FIG. 1 is a schematic view illustrating an example of the configuration of a PLC system to which a support device according to this embodiment can be applied.

First, an example of the configuration of a PLC system 1 to which a support device 300 according to this embodiment can be applied will be described. FIG. 1 is a schematic view illustrating an example of the configuration of the PLC system 1 to which the support device 300 according to this embodiment can be applied.

The PLC system 1 will be described with reference to FIG. 1. The PLC system 1 is an example of a control system for controlling control targets such as facilities, devices, and the like and automating a production process. Typically, the PLC system 1 includes a CPU unit 10, a power supply unit 100, and an input/output (I/O) unit 200. The CPU unit 10 is a subject that executes various programs including a control program. The CPU unit 10 includes a universal serial bus (USB) interface 51 that can be connected to the support device 300. The CPU unit 10 exchanges data with the support device 300 through the USB interface 51. The power supply unit 100 converts a voltage of an input power input from the outside and supplies power to the CPU unit 10 and the I/O unit 200. The I/O unit 200 is connected to the CPU unit 10 through a system bus 202, exchanges signals with the CPU unit 10, and exchanges signals from the field.

The support device 300 is a device that supports development of a control program executed by the PLC system 1. The support device 300 has a function for providing an environment for developing user programs including a control program executed by the PLC system 1, a function for setting the control program and various kinds of information in the PLC system 1, a function for acquiring a state value of the PLC system 1 during operation, and the like.

<Application Example>

Figure 2:
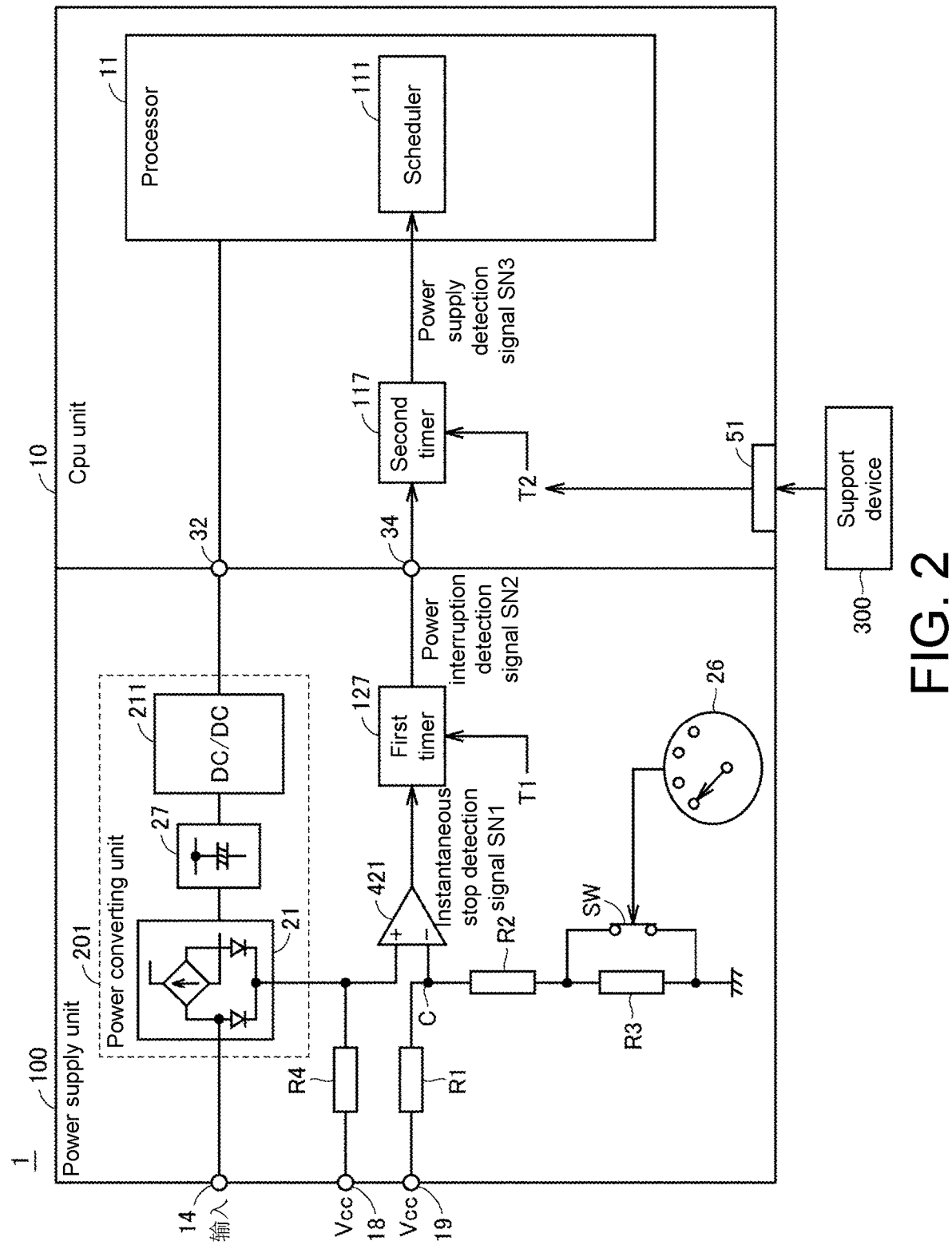
FIG. 2 is a diagram illustrating an example of a situation in which settings of a power supply unit and a CPU unit according to this embodiment are applied.

Next, an example of a situation in which the present disclosure is applied will be described with reference to FIG. 2. FIG. 2 is a diagram illustrating an example of a situation in which settings of the power supply unit 100 and the CPU unit 10 according to this embodiment are applied. In this embodiment, the power supply unit 100 receives input power input from the outside through an input terminal 14. The power received through the input terminal 14 is supplied to a rectification circuit 21. The rectification circuit 21 supplies power after full wave rectification to a power converting unit 201. The power converting unit 201 converts a voltage of supplied power.

A part of an input power is charged into a capacitor 27 of the power converting unit 201, and the remainder of the input power is voltage converted by a DC/DC converter 211. After changing the voltage of the supplied power, the power converting unit 201 supplies the power after the conversion to the CPU unit 10 through an output terminal 32. The CPU unit 10 is driven by the voltage (for example, 5 V) of the supplied power.

In addition, an input voltage is also supplied to a non-inverting input terminal of a comparator 421 through the power converting unit 201. A control voltage Vcc (for example, 5 V), which is input through an input terminal 18, is input to the non-inverting input terminal of the comparator 421. The control voltage Vcc (for example, 5 V) is divided by a resistor R1 and a resistor R2 connected in series through an input terminal 19 and is input to the inverting input terminal of the comparator 421 as a threshold voltage Vn (for example, 2.5 V).

One end of the resistor R3 is connected to the resistor R2 in series, and the other end is grounded. In addition, a switch SW is connected to the resistor R3 in parallel. A voltage based on the control voltage Vcc is divided by the resistor R1 and the resistor R2 when the switch SW is on. In other words, when the switch SW is on, the resistor R3 forms a short circuit, and a resistance value thereof substantially becomes 0Ω. The comparator 421 compares an amplitude value (for example, 0 to 5 V) of an input voltage input to the inverting input terminal with the threshold voltage Vn input to the non-inverting input terminal and, in a case in which the amplitude value becomes lower than the threshold voltage Vn, outputs an instantaneous stop detection signal SN1 that is a signal indicating that a predetermined voltage will not be supplied to the power supply unit 100.

Here, in a case in which the threshold voltage Vn remains a value that has been previously set without any change (for example, in the case of being a fixed value of 2.5 V), in a production site or the like in which variations in a power supply voltage frequently occur, there are cases in which an amplitude value representing the magnitude of an input voltage frequently becomes below the threshold voltage Vn. As a result, the instantaneous stop detection signal SN1 is repeatedly output from the comparator 421 in a short time, and a frequency at which the PLC system 1 ends the operation based on this signal increases. There is concern that the operation rate of the PLC system 1 may decrease in this way. In contrast to this, by changing the setting of the threshold voltage Vn, a decrease in the operation rate can be prevented as well. The setting of the threshold voltage Vn can be changed by an external operation on the power supply unit 100. More specifically, by a user operating a changeover switch 26 disposed on the surface of a casing of the power supply unit 100, the setting of the threshold voltage Vn is changed. Due to a user operating the changeover switch 26, the resistance value of the resistor R3 changes. For example, in a case in which the switch SW is on, the resistor R3 forms a short circuit. On the other hand, in a case in which the switch SW is off, the resistor R3 does not form a short circuit, and the control voltage Vcc is divided to the resistor R1, the resistor R2, and the resistor R3. In this way, in a case in which the switch SW is on, the threshold voltage Vn is made lower than that of a case in which the switch SW is off. In this way, a frequency at which the amplitude value becomes smaller than the threshold voltage Vn is low in the PLC system 1, and a decrease in the operation efficiency of the system can be prevented.

In this way, in a case in which the set threshold voltage Vn is below the amplitude value of the input voltage, an instantaneous stop detection signal SN1 is output from an output terminal of the comparator 421 to a first timer 127. The first timer 127 measures a time over which the amplitude value has been lower than the threshold voltage Vn, and the state has continued. In a case in which it is detected that the measured time is over a time T1 (for example, 10 seconds) set in advance, the first timer 127 outputs a power interruption detection signal SN2. The power interruption detection signal SN2 is input to a second timer 117 of the CPU unit 10 through an output terminal 34. The power interruption detection signal SN2 is a signal used for notifying that predetermined power cannot be supplied from the power supply unit 100 to the CPU unit 10. The second timer 117 measures a time over which a state, in which the amplitude value is lower than the threshold voltage Vn, has continued after receiving the power interruption detection signal SN2. In a case in which it is detected that the measured time is over a time T2 set in advance, the second timer 117 outputs a power supply detection signal SN3 to the processor 11. The time T2, as will be described below, is a time that can be adjusted by a user operation. Hereinafter, the time T2 will be referred to as an adjustment time T2.

The processor 11 is driven using a voltage (for example, 5 V) of power supplied from the output terminal 32 of the power supply unit 100. The processor 11 executes various processes of the CPU unit 10 by expanding and executing various programs recorded in a storage (a storage 150 illustrated in FIG. 5 to be described below). More specifically, the processor 11 executes a scheduler 111. The scheduler 111 determines an execution sequence, execution interruption, and the like of a plurality of processes in accordance with a control period set in advance. More specifically, the scheduler 111 allocates processing resources to a control program execution process, peripheral processes including various processes, and input/output processes in accordance with a priority level, a control period, and the like set in advance. For example, after the power interruption detection signal SN2 is input to the second timer 117, the scheduler 111 causes the processor 11 to continue execution of a normal arithmetic operation process (normal process) during the adjustment time T2. Normal processes, for example, refer to processes of tasks that are periodically executed, interrupt tasks, and the like and refer to processes other than tasks that are in preparation for stopping of the supply of power. Then, in a case in which a state in which the amplitude value is lower than the threshold voltage Vn continues even when the adjustment time T2 elapses, the scheduler 111 causes the processor 11 to execute pre-stop processing in preparation for stopping of supply of power to the PLC system 1 in place of an arithmetic operation process that is currently being executed. More specifically, the scheduler 111 causes the processor 11 to execute a process of saving data during execution of a process in a memory card (for example, a memory card 178 illustrated in FIG. 5) or the like.

Here, until the PLC system 1 stops after the comparator 421 outputs the instantaneous stop detection signal SN1, the PLC system 1 is driven using power charged into the capacitor 27. For this reason, in a case in which the threshold voltage Vn of the comparator 421 of the power supply unit 100 is set, for example, to be lower than 2.5 V, when a frequency of detection of stopping of supply of power decreases, an output timing of the instantaneous stop detection signal SN1 is delayed compared with that of a case in which the threshold voltage Vn is set to 2.5 V. In accordance with such a delay, a voltage charged into the capacitor 27 becomes lower than that before the output timing of the instantaneous stop detection signal SN1 was delayed (when the threshold voltage Vn is 2.5 V), and a time in which the PLC system 1 can operate after the output timing of the instantaneous stop detection signal SN1 is shortened. More specifically, a total time of the time T1 until the first timer 127 outputs the power interruption detection signal SN2, an adjustment time T2 until the second timer 117 outputs the power supply detection signal SN3, and a time in which pre-stop processing is executed is shortened. In a case in which the time T1 (for example, 10 sec) is a constant time, in order to secure the time of the pre-stop processing (for example, 5 sec), the length of the adjustment time T2 needs to be shortened (For example, 10 sec→5 sec).

The setting of the adjustment time T2 can be changed by an external operation on the CPU unit 10. More specifically, the setting of the adjustment time T2 is changed by a user operating the support device 300 that is electrically connected through the USB interface 51 of the CPU unit. For example, a user can change the time of the previous-time setting of the adjustment time T2 to a time shorter than the time by operating an input unit such as a keyboard, a mouse, or the like of the support device 300. In this way, a user can set the adjustment time T2 to an arbitrary time. According to the description until now, the PLC system 1 can decrease a frequency at which the operation of the system ends in due to stopping of supply of power, and an execution time of pre-stop processing in preparation for stopping of supply of power can be reliably secured by changing the threshold voltage Vn and the adjustment time T2. In addition, information relating to the adjustment time T2 is stored in the storage 150 illustrated in FIG. 5 to be described below as setting information 154.

<Example of Configuration of Power Supply Unit>

Figure 3:
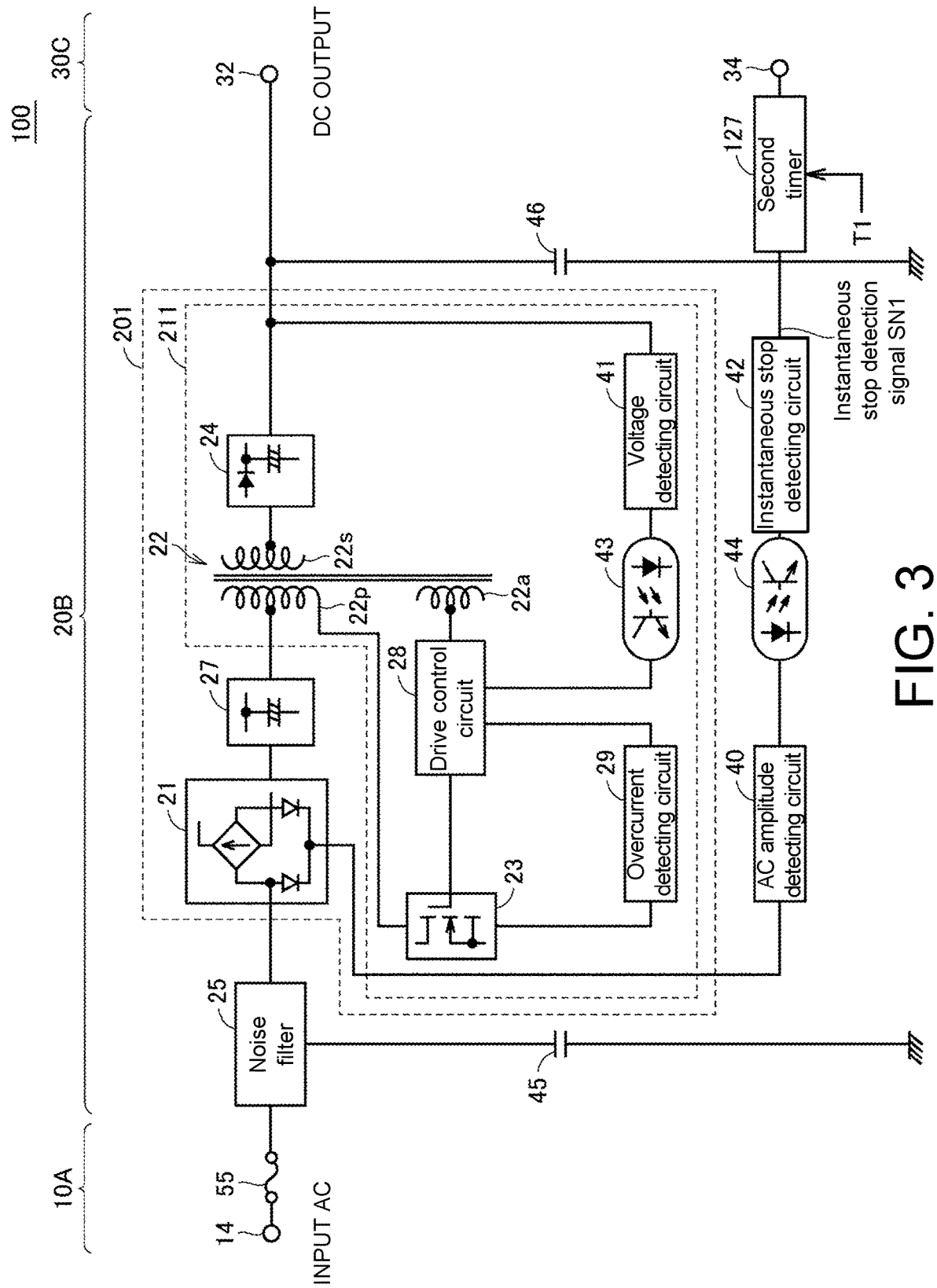
FIG. 3 is a diagram illustrating an example of the circuit configuration of a power supply unit according to this embodiment.

Next, an example of the configuration of the power supply unit 100 will be described with reference to FIG. 3. FIG. 3 is a diagram illustrating an example of the circuit configuration of the power supply unit 100 according to this embodiment. The power supply unit 100, for example, is a switching power supply device. The power supply unit 100 includes an input unit 10A, a power supply unit 20B, and an output unit 30C.

The input unit 10A is connected to an AC power supply (for example, a commercial power supply of 50 Hz/60 Hz, 100 V/200 V). The input unit 10A includes an input terminal 14 and a fuse 55 connected to the input terminal 14. The fuse 55 is an example of a protection circuit according to this embodiment.

The power supply unit 20B generates power used for driving the CPU unit 10 based on power input from the input unit 10A. As one example, the power supply unit 20B includes a rectification circuit 21, a transformer 22, a MOSFET 23 as a switching device, a rectification smoothing circuit 24, a noise filter 25, a capacitor 27, a drive control circuit 28, an overcurrent detecting circuit 29, an AC amplitude detecting circuit 40, a voltage detecting circuit 41, an instantaneous stop detecting circuit 42, a photo coupler 43, a photo coupler 44, a capacitor 45, and a capacitor 46. In addition, as elements configuring the power converting unit 201 of the power supply unit 20B, there are the rectification circuit 21, the transformer 22, the MOSFET 23, the rectification smoothing circuit 24, the capacitor 27, the drive control circuit 28, the overcurrent detecting circuit 29, the voltage detecting circuit 41, and the photo coupler 43. In addition, as elements configuring the DC/DC converter 211, there are remaining circuits and the like when the rectification circuit 21 and the capacitor 27 included in the power converting unit 201 are excluded.

The noise filter 25 performs filtering for a high-frequency noise component superimposed in an AC voltage input to INPUT and supplies an AC voltage from which the noise component has been eliminated to the rectification circuit 21. The capacitor 27 is charged using a voltage after full-wave rectification and supplies the charged voltage to the transformer 22. More specifically, the capacitor 27 is charged using a part of the voltage after full-wave rectification, smooths the remaining voltage, and supplies a resultant voltage to the transformer 22. In addition, the rectification circuit 21 supplies the voltage after full-wave rectification also to the AC amplitude detecting circuit 40 together with the capacitor 27.

The transformer 22 includes a primary winding 22p, a secondary winding 22s, and an auxiliary winding 22a and induces a high-frequency pulse voltage generated in the primary winding 22p in the secondary winding 22s and the auxiliary winding 22a. The high-frequency pulse voltage induced in the secondary winding 22s is used for DC output, and the high-frequency pulse voltage induced in the auxiliary winding 22a is used for operating the drive control circuit 28.

The rectification smoothing circuit 24 is composed of a half-wave rectification circuit of a diode and a capacitor, performs half-wave rectification and then smoothing on a high-frequency pulse voltage induced in the secondary winding 22s of the transformer 22, and generates power of a DC output having a predetermined output voltage and a predetermined output current.

The voltage detecting circuit 41 detects a DC voltage. The photo coupler 43 outputs a signal corresponding to the detected voltage to the drive control circuit 28.

The drive control circuit 28 is configured by a control IC including a pulse width modulation (PWM) signal generator, a feedback control circuit, an over current protect (OCP) terminal, a switching driving terminal, a driving power supply terminal, and the like. The drive control circuit 28 drives the MOSFET 23 by supplying a PWM signal to a gate of the MOSFET 23.

A secondary-side voltage detected by the voltage detecting circuit 41 is fed back to the drive control circuit 28 through the photo coupler 43. The drive control circuit 28 changes a duty ratio of the PWM signal based on the fed back voltage and drives the MOSFET 23 such that an output voltage becomes a predetermined voltage.

The MOSFET 23 is connected to the primary winding 22p of the transformer 22 in series. The MOSFET 23 turns off/on a primary-side voltage in response to a PWM signal supplied from the drive control circuit 28, thereby generating a high-frequency pulse voltage in the primary winding 22p of the transformer 22. A voltage generated by the power supply unit 20B is output from the output unit 30C. The output unit 30C outputs a voltage generated by the power supply unit 20B. The output unit 30C includes an output terminal 32 (DC OUTPUT). In the configuration illustrated in FIG. 3, a DC voltage is output as an output voltage.

As described above, the rectification circuit 21 supplies a voltage after full-wave rectification to the AC amplitude detecting circuit 40. The AC amplitude detecting circuit 40 outputs an input voltage to the instantaneous stop detecting circuit 42 through the photo coupler 44. In a case in which the input voltage is lower than the threshold voltage Vn, the instantaneous stop detecting circuit 42 outputs the input voltage to the first timer 127. In a case in which the state in which the input voltage is lower than the threshold voltage Vn continues for a time T1 set in advance or longer, the first timer 127 outputs the instantaneous stop detection signal SN1 to the CPU unit 10 through the output terminal 34.

<Example of Configuration of AC Amplitude Detecting Circuit and Instantaneous Stop Detecting Circuit>

Figure 4:
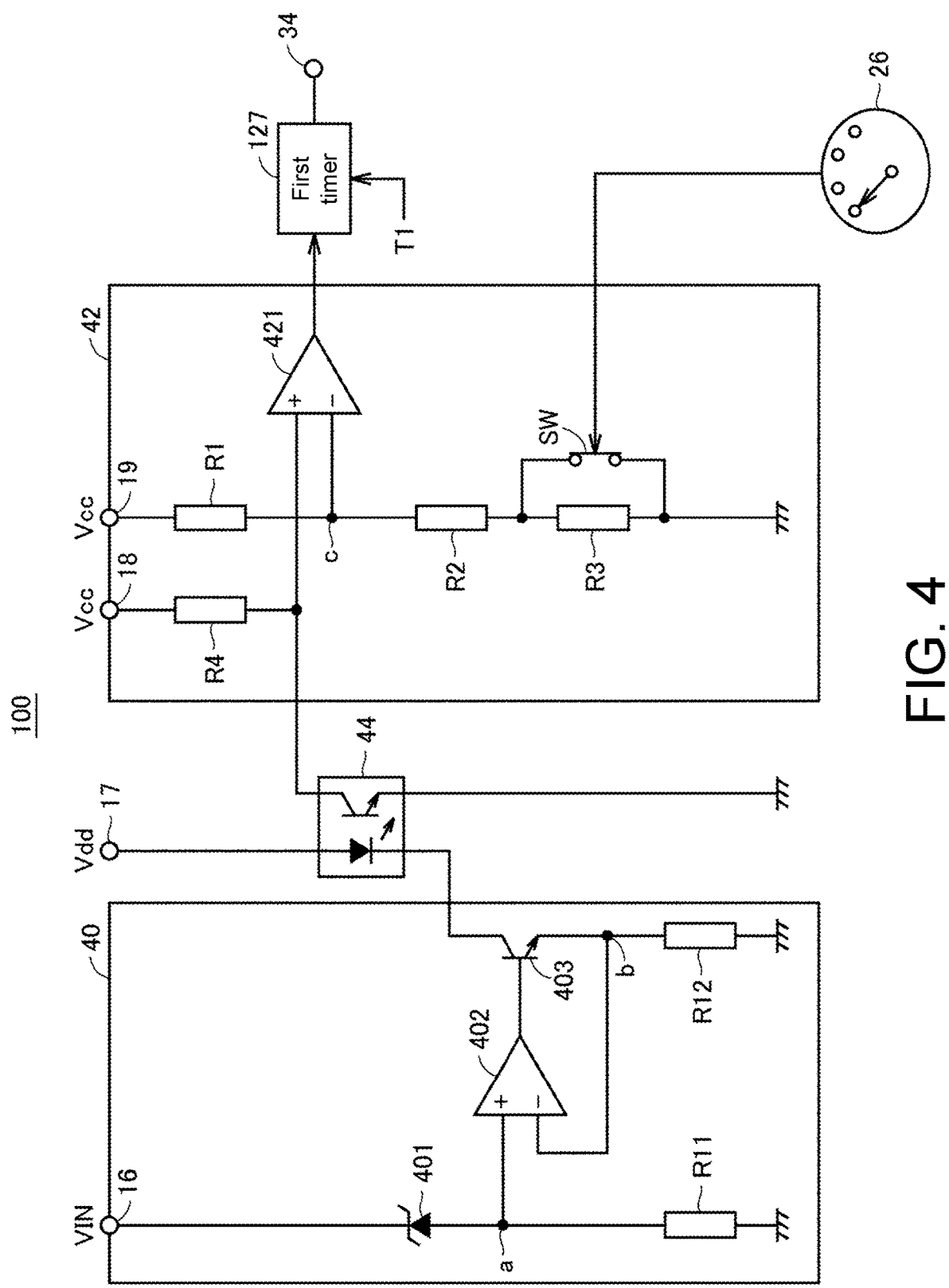
FIG. 4 is a diagram illustrating an example of the circuit configuration of an AC amplitude detecting circuit and an instantaneous stop detecting circuit according to this embodiment.

The operations of the AC amplitude detecting circuit 40 and the instantaneous stop detecting circuit 42 will be described with reference to FIG. 4. FIG. 4 is a diagram illustrating an example of the circuit configuration of the AC amplitude detecting circuit 40 and the instantaneous stop detecting circuit 42 according to this embodiment.

The AC amplitude detecting circuit 40 is a circuit that detects a magnitude (amplitude value) of a signal relating to the voltage VIN that has been full-wave rectified by the rectification circuit 21. For example, the AC amplitude detecting circuit 40 includes a Zener diode 401, an operational amplifier 402, a transistor 403, a resistor R11, and a resistor R12.

The Zener diode 401 has a cathode connected to an input terminal 16 and an anode connected to a non-inverting input terminal of the operational amplifier 402 through a node a. In addition, the anode of the Zener diode 401 is connected to one end of the resistor R11 in series through the node a. The other end of the resistor R11 is grounded. A voltage VIN is input to the non-inverting input terminal of the operational amplifier 402 through the node a. An output signal from an output terminal of the operational amplifier 402 is fed back and is input to the inverting input terminal of the operational amplifier 402. More specifically, an output signal from the operational amplifier 402 is input to a base of the transistor 403, and the transistor 403 comes into an on state. In this way, when the transistor 403 comes into the on state, a control voltage Vdd (for example, 5 V) supplied to the input terminal 17 is input to the inverting input terminal through a node b.

In addition, a voltage (amplitude value) is amplified based on an output voltage of the operational amplifier 402, and then is input to a non-inverting input terminal of the comparator 421 of the instantaneous stop detecting circuit 42 through the photo coupler 44. The instantaneous stop detecting circuit 42 includes a comparator 421, a resistor R1, a resistor R2, a resistor R3, a resistor R4, and a switch SW. A voltage in the range of 0 to 5 V based on the control voltage Vcc (for example, 5 V) supplied using the input terminal 18 is input to the non-inverting input terminal of the comparator 421 through the resistor R4. The resistor R4 is a pull up resistor that raises the voltage of the non-inverting input terminal. A voltage based on the control voltage Vcc (for example, 5 V) supplied to the input terminal 19 is input to the non-inverting input terminal of the comparator 421. More specifically, a voltage acquired by dividing the control voltage Vcc input to the input terminal 19 by the resistors R1 and R2 is input to the inverting input terminal though a node c.

The node c is disposed between the resistor R1 and the resistor R2 connected in series. In addition, the control voltage Vcc is divided by the resistor R1 and the resistor R2 when the resistor R3 connected to the resistor R2 in series forms a short circuit, and a resistance value thereof substantially becomes 0Ω. In other words, this is in a case in which the switch SW disposed in parallel with the resistor R3 is in the on state. In a case in which the switch SW is in an off state, the control voltage Vcc is divided by the resistor R1, the resistor R2, and the resistor R3. In a case in which the switch SW is in the on state, a voltage (threshold voltage) input to the inverting input terminal of the comparator 421 is lower than that of the case of the off state. In other words, also in a case in which the amplitude value of a voltage input to the non-inverting input terminal of the comparator 421 is small, a state in which the voltage is equal to or lower than the threshold voltage Vn is relatively short, and thus, a frequency at which the instantaneous stop detection signal SN1 is output from the output terminal of the comparator 421 to the first timer 127 decreases. As a result, the power interruption detection signal SN2 is not frequently input to the CPU unit 10, and the PLC system 1 does not frequently stop, and accordingly, a decrease in the operation rate of the PLC system 1 can be prevented.

The on/off switching of the switch SW is performed by an external operation on the changeover switch 26. In other words, the setting of the threshold voltage Vn of the comparator 421 can be changed by an external operation using the changeover switch 26. The changeover switch 26, for example, is a DIP switch, a rotary switch, or the like. The changeover switch 26, for example, is disposed on the surface of the power supply unit 100. In this way, the power supply unit 100 can easily receive change of the threshold voltage Vn using a user's manual operation. In addition, a user can easily change the threshold voltage Vn.

In addition, in description of this embodiment, the number of resistors connected to the resistor R2 in series is assumed to be one (the resistor R3), and the number of switches connected to the resistor R3 in parallel is assumed to be one (the switch SW). However, the number of resistors connected to the resistor R2 in series may be two or more. In a case in which the number of resistors is two or more, a switch may be disposed in parallel with each of the resistors. For example, in a case in which three resistors are connected to the resistor R2 in series, a switch may be disposed in parallel with each of the three resistors. By configuring on/off of three switches disposed in parallel with the three resistors to be able to switch a resistance value in a stepped manner (for example four levels from 0Ω to a maximum resistance value) using the changeover switch 26, compared to a case in which the number of resistors and switches is small, the threshold voltage Vn can be set to a more fine value.

<Hardware Configuration of CPU Unit>

Figure 5:
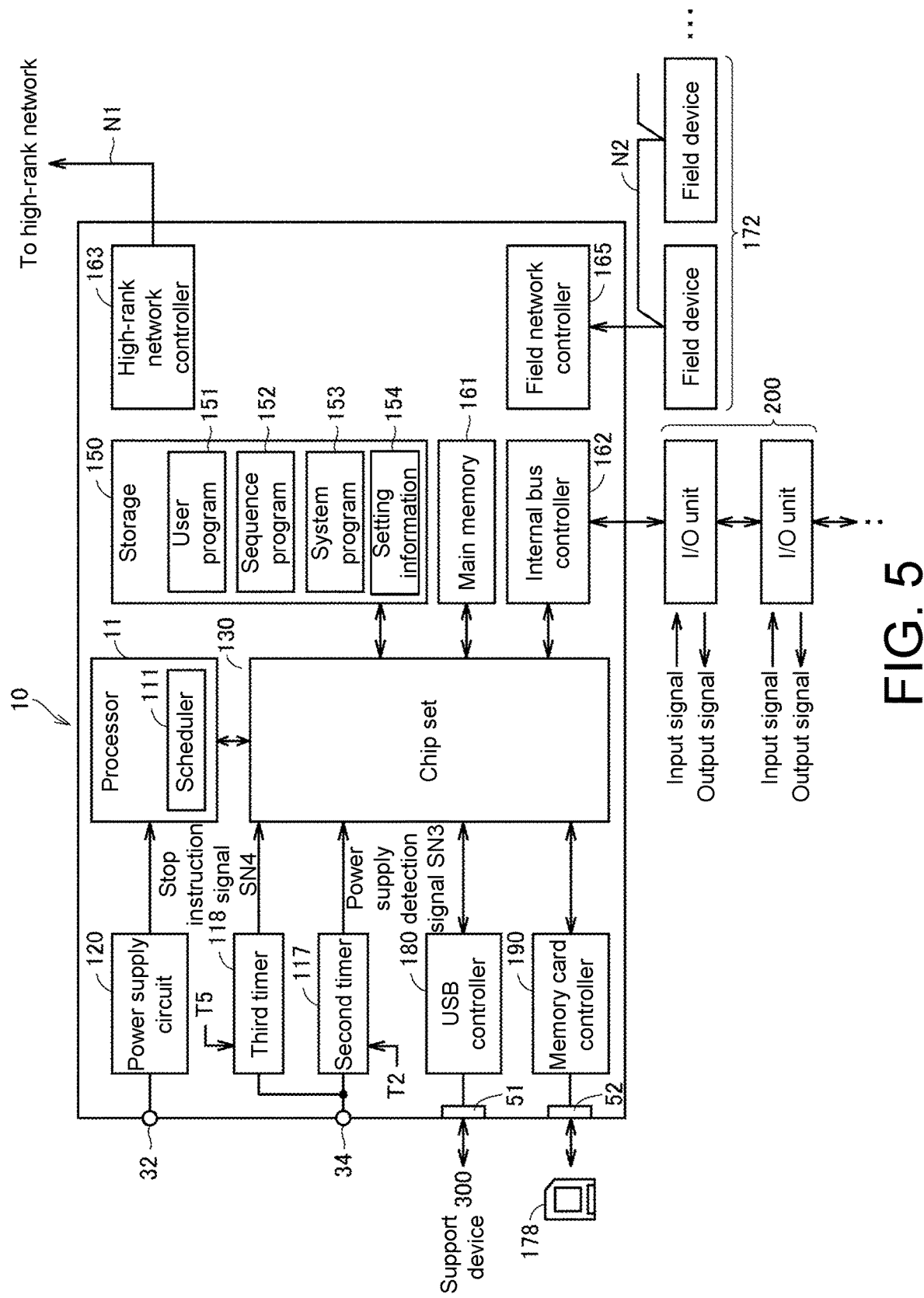
FIG. 5 is a diagram illustrating an example of the hardware configuration of a CPU unit according to this embodiment.

Next, a configuration for executing the process of stopping supply of power that is executed by the CPU unit 10 will be described with reference to FIG. 5. FIG. 5 is a diagram illustrating an example of the hardware configuration of the CPU unit 10 according to this embodiment. The CPU unit 10 is an arithmetic operation processing unit and includes a processor 11, a second timer 117, a third timer 118, a power supply circuit 120, a chip set 130, a storage 150, a main memory 161, an internal bus controller 162, a high-rank network controller 163, a field network controller 165, a USB controller 180, and a memory card controller 190.

The processor 11 is composed of a central processing unit (CPU), a micro processing unit (MPU), a graphics processing unit (GPU), and the like. The processor 11 may employ a configuration having a plurality of cores, and a plurality of processors 11 may be disposed. In other words, the CPU unit 10 includes one or a plurality of processors 11 and/or a processor 11 including one or a plurality of cores. The chip set 130 realizes the process of the CPU unit 10 as a whole by controlling the processor 11 and peripheral elements. The storage 150, for example, is configured by a nonvolatile memory device such as a hard disk drive (HDD) or a solid state drive (SSD) or the like. The main memory 161 is configured by a volatile memory device such as a dynamic random access memory (DRAM) or a static random access memory (SRAM) or the like.

The processor 11 reads various programs stored in the storage 150 and expands and executes the programs in the main memory 161, thereby realizing control and various processes corresponding to control targets. In the storage 150, in addition to a system program 153 for realizing basic functions, a sequence program 152, a user program 151, and setting information 154 generated in accordance with a manufacturing apparatus and facilities that are control targets are stored. The system program 153 is a software group used for providing functions of the CPU unit 10. More specifically, the system program 153 includes a scheduler program and other system programs. The sequence program 152 is entirely scanned for each execution and has a concept including a program that can output a control instruction for each execution. In the sequence program 152, a sequence command and/or a motion command may be included. Basically, the sequence program 152 is arbitrarily generated by a user in accordance with a control target and an application.

The user program 151 is generated based on a user's purpose of control. In other words, the user program is a program that is arbitrarily designed in accordance with a target line (process) or the like controlled using the PLC system 1. The user program 151 realizes a user's purpose of control in cooperation with the sequence program 152. In other words, the user program 151 realizes a programmed operation by using a command, a function, a functional module, and the like provided by the sequence program 152.

The setting information 154 includes information that defines a configuration and settings of the PLC system 1 including the CPU unit 10. The setting information includes measurement times of the first timer 127, the second timer 117, and the third timer 118. More specifically, the setting information 154 includes information of a time T1, an adjustment time T2, and a time T5 that are times to be measured by the timers. In addition, the setting information 154 includes information of a user program and setting values associated with a field device 172 connected to a field network N2 and information of a user program and setting values associated with a device connected to a high-rank network N1. The high-rank network controller 163 controls exchange of data with other devices such as a server apparatus and the like through the high-rank network N1.

The internal bus controller 162 controls exchange of data with the I/O unit 200 installed in the CPU unit 10. More specifically, the internal bus controller 162 functions as a transmission buffer of data (output data) output to the I/O unit 200 and a reception buffer of data (input data) input from the I/O unit 200. In addition, output data generated by an arithmetic operation process of the processor 11 is stored in the storage 150. Output data to be transmitted to a specific I/O unit 200 is read from the storage 150 and is temporarily stored in the transmission buffer. In addition, input data transmitted from the I/O unit 200 is temporarily stored in the reception buffer and then is moved to the storage 150.

In addition, the internal bus controller 162 performs a process of transmitting output data of the transmission buffer and a process of receiving input data and storing the input data in the reception buffer for the I/O unit 200. Typically, the internal bus controller 162 provides functions of a physical layer and a data link layer in an internal bus. The field network controller 165 controls exchange of data with the field device 172 through the field network N2. In other words, the field network controller 165 controls transmission of output data and reception of input data in accordance with the specifications of the field network N2. More specifically, the field network controller 165 functions as a transmission buffer of data (output data) output to the field device 172 and a reception buffer of data (input data) input from the field device 172.

In addition, the output data generated by an arithmetic operation process using the processor 11 is stored in the storage 150. Output data to be transmitted to a specific field device 172 is read from the storage 150 and is temporarily stored in the transmission buffer. In addition, input data transmitted from the field device 172 is temporarily stored in the reception buffer and then is moved to the storage 150. In addition, the field network controller 165 performs a process of transmitting output data of the transmission buffer and a process of receiving input data and storing the input data in the reception buffer for the field device 172. Typically, the field network controller 165 provides functions of a physical layer and a data link layer in the field network N2.

The power supply circuit 120 supplies power acquired through the output terminal 32 of the power supply unit 100 to the processor 11. The second timer 117 measures a time over which a state, in which the amplitude value is lower than the threshold voltage Vn, has continued after start of reception of the power interruption detection signal SN2 from the first timer 127 through the output terminal 34. In a case in which it is detected that the measured time is over the adjustment time T2 set in advance, the second timer 117 outputs the power supply detection signal SN3 to the processor 11 through the chip set 130.

When the power supply detection signal SN3 is received, the processor 11 operates the scheduler 111. The scheduler 111 determines an execution sequence, an execution interruption, and the like of a plurality of processes in accordance with a control period set in advance. The scheduler 111 allocates process resources (a processor time, a memory, and the like) to a control program execution process, peripheral processes including various processes, and an input/output process in accordance with priority levels, control periods, and the like set in advance. More specifically, when the power supply detection signal SN3 is received, the scheduler 111 executes not a process relating to stopping of supply of power but a normal arithmetic operation process during the adjustment time T2. In a case in which a pre-stop processing execution instruction signal is received from the second timer 117 in accordance with having been over the adjustment time T2, the scheduler 111 executes pre-stop processing in place of a normal arithmetic operation process (normal process) that is being currently executed. For example, data is input to the memory card controller 190 through a memory card interface 52. In this way, the memory card controller 190 controls exchange of data with the memory card 178. The processor 11 writes data during execution of the process into the memory card 178 under control of the memory card controller 190, thereby executing pre-stop processing for temporarily saving the data from the CPU unit 10. The CPU unit 10 is configured such that the memory card 178 can be installed or uninstalled in this way and can record data in the memory card 178 and read various kinds of data from the memory card 178.

Here, as described above, the adjustment time T2 set in the second timer 117 is changed by an external operation on the CPU unit 10. More specifically, when a user operates the support device 300, data is input to the USB controller 180 through the USB interface 51 that is electrically connected to the support device 300. In this way, the USB controller 180 controls exchange of data with the support device 300 through the USB interface 51. The processor 11 executes a process by receiving information input by a user using the support device 300 through the USB interface 51. In this way, by configuring the setting of the adjustment time T2 to be changeable, after supply of power is stopped, the PLC system 1 can reliably execute a process in preparation for stopping of supply of power in place of the arithmetic operation process that is currently being executed.

In addition, similar to the second timer 117, the third timer 118 receives a power interruption detection signal SN2 output from the first timer 127 through the output terminal 32. The third timer 118 measures a time until the arithmetic operation of the CPU unit 10 ends after start of reception of the power interruption detection signal SN2. In a case in which it is detected that the measured time is over a time T5 set in advance, the third timer 118 outputs a stop instruction signal SN4 to the processor 11 through the chip set 130. This stop instruction signal SN4 is a signal for stopping the execution of a program of the processor 11 and ending the operation of the PLC system 1. For this reason, the PLC system 1 can end the operation of the system at an appropriate timing corresponding to a remaining power after stopping of the supply of power. In addition, since the time T5 is a time that includes the adjustment time T2, by changing the length of the adjustment time T2, the length of this time T5 is also changed. Then, in a case in which the length of the adjustment time T2 is changed, it is changed such that the pre-stop processing is completed before the operation of the PLC system 1 ends. In other words, the length of the adjustment time T2 is changed such that the pre-stop processing ends before the time T5 elapses. In this way, by adjusting the adjustment time T2 included in the time T5, even after the supply of power is stopped, the PLC system 1 is caused to end the operation of the system after a necessary process is completed.

Figure 6:
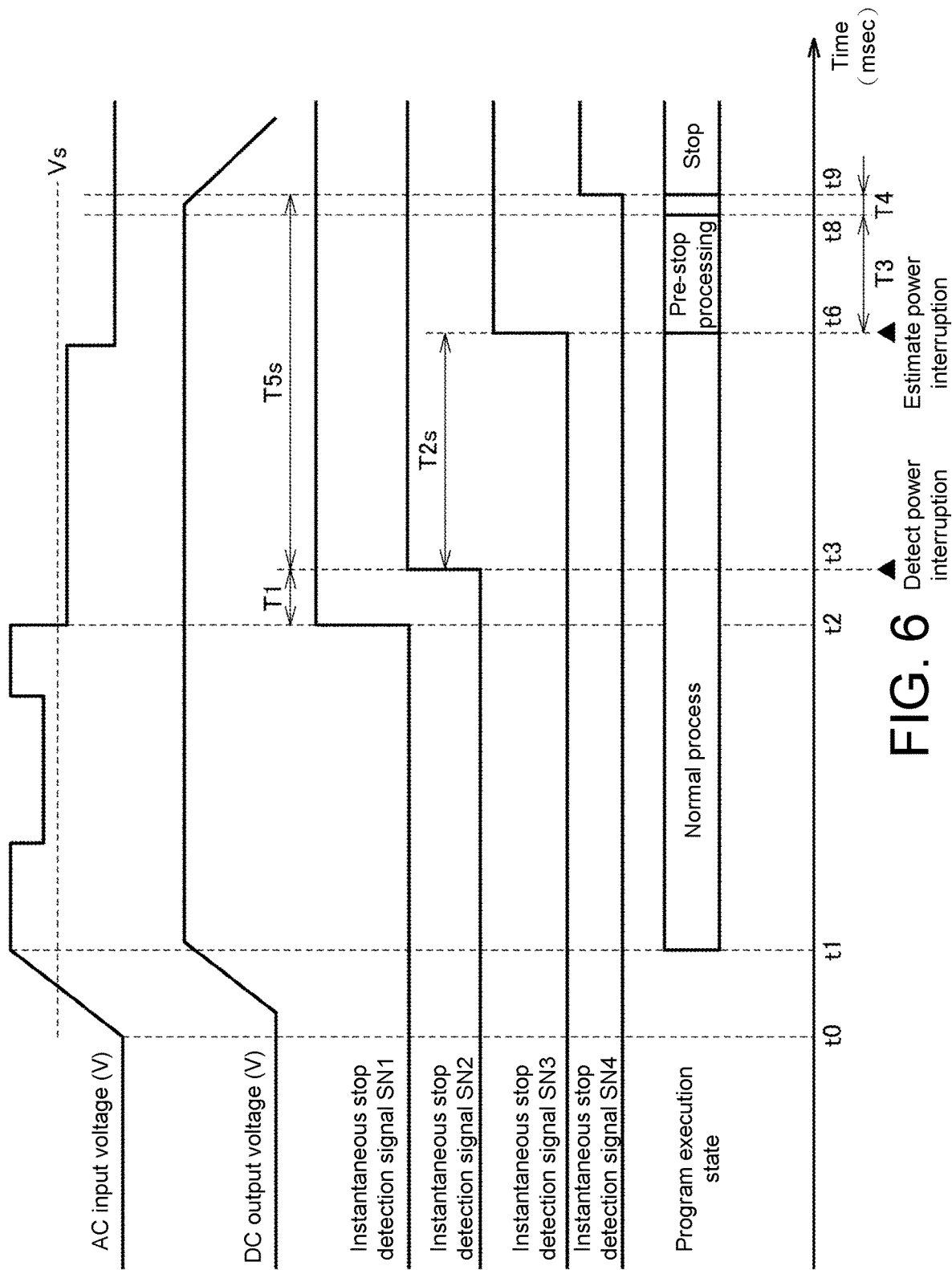
FIG. 6 is a timing diagram illustrating a process in a case in which a threshold voltage Vn, an adjustment time T2, and a time T5 according to this embodiment have values set at the previous time (a previous setting value).

Next, the change of the setting of the threshold voltage Vn of the power supply unit 100 and the change of the setting of the adjustment time T2 of the second timer 117 of the CPU unit 10 will be described with reference to FIGS. 6 and 7. FIG. 6 is a timing diagram illustrating a process in a case in which the threshold voltage Vn, the adjustment time T2, and the time T5 according to this embodiment have values set at a previous time (a previous-time setting value). Hereinafter, a previous-time setting value of the threshold voltage will be described as Vs, a previous-time setting value of the adjustment time T2 will be described as T2s, and a previous-time setting value of the time T5 will be described as T5s. In FIG. 6, the horizontal axis represents the time (msec), and the vertical axis represents an AC input voltage (V), a DC output voltage (V), an instantaneous stop detection signal SN1, a power interruption detection signal SN2, a power supply detection signal SN3, a stop instruction signal SN4, and a program execution state.

More specifically, the AC input voltage represents a voltage value of a voltage input to the non-inverting input terminal of the comparator 421 of the power supply unit 100. The DC output voltage represents a voltage value of a voltage output from the output terminal 32. The instantaneous stop detection signal SN1 is a signal (high signal) that is output from the output terminal of the comparator 421 in a case in which the AC input voltage input to the non-inverting input terminal of the comparator 421 is lower than a threshold voltage Vs. The power interruption detection signal SN2 is a signal (high signal) that is output at a timing at which the time T1 set in advance has elapsed from a timing at which the input of the instantaneous stop detection signal SN1 was received by the first timer 127. The power supply detection signal SN3 is a signal (high signal) that is output at a timing at which an adjustment time T2s set in advance has elapsed from a timing at which the second timer 117 started to receive the power interruption detection signal SN2. The stop instruction signal SN4 is a signal (high signal) that is output at a timing at which a time T5s has elapsed from a timing at which the third timer 118 started to receive the power interruption detection signal SN2.

At a time t0 illustrated in FIG. 6, supply of an input voltage to the input terminal 14 of the power supply unit 100 is started. At a time t1, a part of the input voltage is charged into the capacitor 27, and a remainder thereof is converted into a voltage and is supplied to the CPU unit 10 through the output terminal 32. For this reason, at the time t1, the AC input voltage becomes equal to or higher than the threshold voltage Vs, and the DC output voltage also becomes a voltage (for example, 5 V) for operating the processor 11. In addition, as the program execution state, the processor 11 executes a normal task. A normal task is a task that is periodically executed, or an interrupt task other than a task that is executed with priority in accordance with stop of the power supply.

At a time t2, in a case in which the AC input voltage becomes lower than the threshold voltage Vs, the instantaneous stop detection signal SN1 is output from the output terminal of the comparator 421 to the first timer 127 (a high signal). In a case in which a state in which the AC input voltage is lower than the threshold voltage Vs continues after start of reception of the instantaneous stop detection signal SN1, and elapse of a time T1 (a time t2 to a time t3) is detected, the first timer 127 outputs the power interruption detection signal SN2 to the second timer 117 of the CPU unit 10 (a high signal). In a case in which elapse of an adjustment time T2s (a time t3 to a time t6) is detected after start of reception of the power interruption detection signal SN2, the second timer 117 outputs the power supply detection signal SN3 to the processor 11 (a high signal). At a time t6, during a time T3 (the time t6 to a time t8) from a timing at which the reception of the power supply detection signal SN3 is started, the processor 11 executes pre-stop processing in place of the arithmetic operation process that is being currently executed. More specifically, the scheduler 111 performs an interrupt process for a normal arithmetic operation process that is being currently executed and executes pre-stop processing.

After a spare time T4 (a time t8 to a time t9) elapses before the PLC system 1 stops after the end of the pre-stop processing, the third timer 118 outputs the stop instruction signal SN4 (a high signal). In accordance with the output of the stop instruction signal SN4, the PLC system 1 ends the operation. In this way, when the AC input voltage becomes lower than the threshold voltage Vs, the instantaneous stop detection signal SN1 is output from the output terminal of the comparator 421. When the state in which the AC input voltage is lower than the threshold voltage Vs continues, and, after a time T1 set in advance elapses, and a time T5s further elapses, the PLC system 1 ends the operation. In addition, the time T5s is a time including the adjustment time T2s, the time T3, and the spare time T4.

Figure 7:
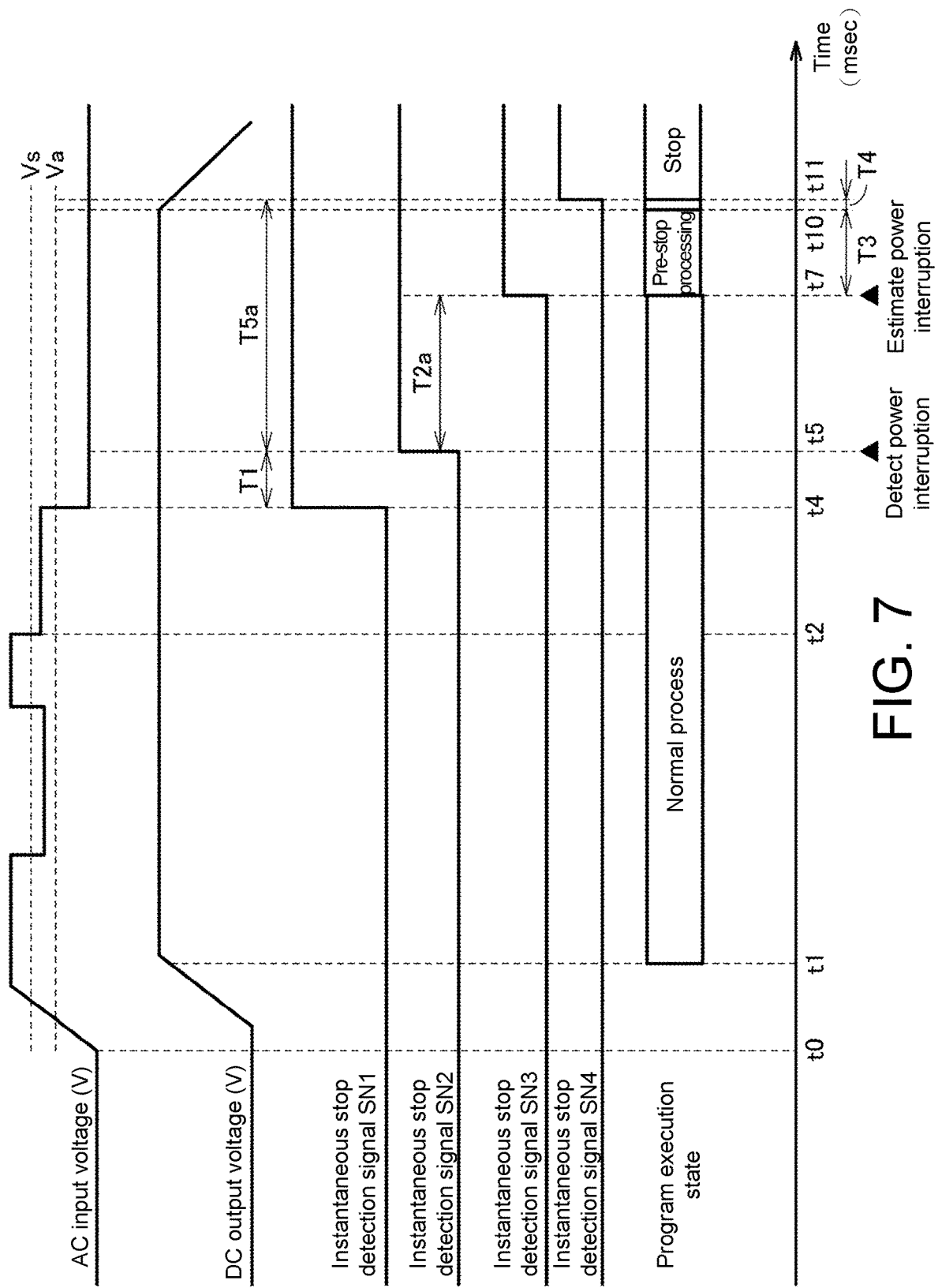
FIG. 7 is a timing diagram illustrating a process in a case in which the threshold voltage Vn, the adjustment time T2, and the time T5 according to this embodiment have been changed from the previous setting values.

FIG. 7 is a timing diagram illustrating a process in a case in which the threshold voltage Vn, the adjustment time T2, and the time T5 according to this embodiment have been changed from the previous-time setting values. The threshold voltage after change will be described as Va, the adjustment time T2 after change will be described as an adjustment time T2a, and a time T5 after change will be described as a time T5a. More specifically, the threshold voltage Va is a voltage lower than Vs. The adjustment time T2a is a time shorter than the adjustment time T2s. The time T5a is a time shorter than the time T5s. Such changes are realized by a user operating the changeover switch 26 and the support device 300.

As illustrated in FIG. 7, for example, when a user lowers the threshold voltage Vs to Va, a timing at which the comparator 421 outputs the instantaneous stop detection signal SN1 becomes a time t4. In other words, the timing becomes a time that is later than the time t2 described with reference to FIG. 6. In a case in which the time T1 before the power interruption detection signal SN2 is output from the first timer 127 after output of the instantaneous stop detection signal SN1, the time T3 of the pre-stop processing (an execution time T3), and the time T4 (the spare time T4) are times of lengths that are the same as those illustrated in FIGS. 6 and 7, the adjustment time T2s needs to be changed to a shorter time. The change of the adjustment time T2s is realized by user's setting using the support device 300. A user changes the adjustment time T2s to a shorter time T2a using the support device 300. The processor 11 executes pre-stop processing during a time T3 (a time t7 to a time t10) after elapse of the adjustment time T2a (a time t5 to a time t7). Then, the PLC system 1 ends the operation after elapse of a time T4 (a time t10 to a time t11). In this way, by adjusting (shortening) the length of the adjustment time T2 from the adjustment time T2s to the adjustment time T2a, the PLC system 1 can reliably secure a time in which pre-stop processing can be executed. The time T5a is a time that includes the adjustment time T2a, the time T3, and the time T4. For this reason, the time T5a is a time that is shorter than the time T5s.

<Hardware Configuration of Support Device>

Figure 8:
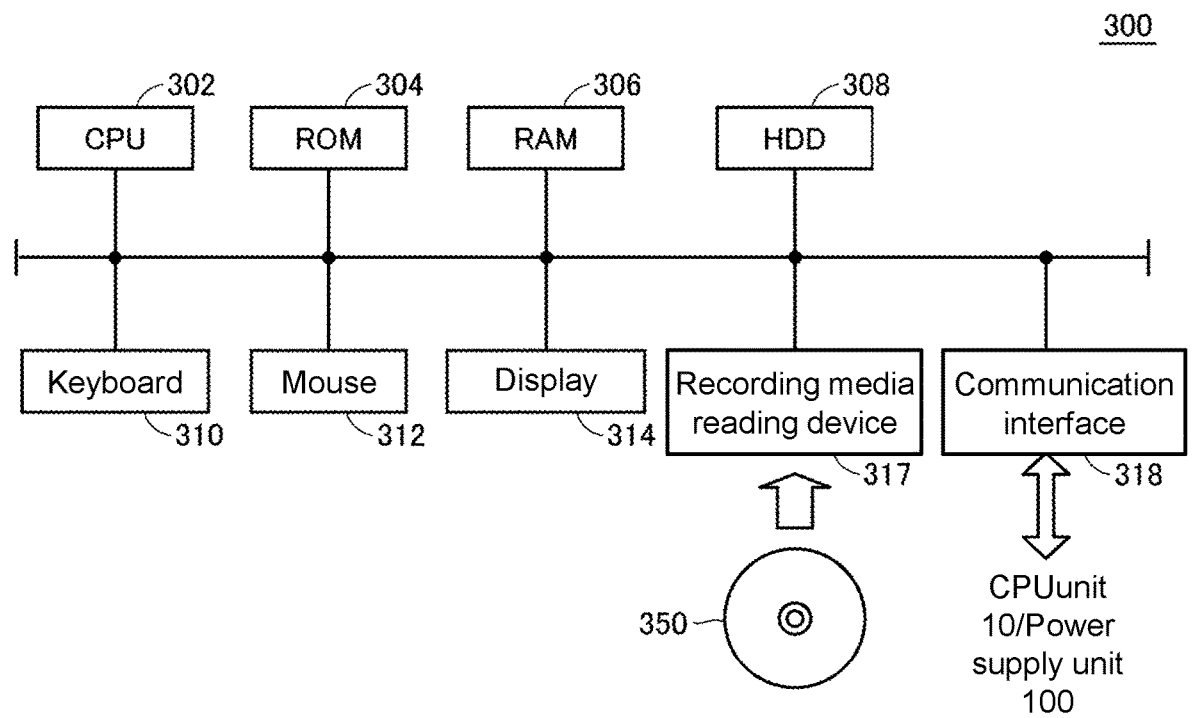
FIG. 8 is a schematic view illustrating an example of the hardware configuration of a support device that is applied to a PLC system according to this embodiment.

Next, an example of the configuration of the support device 300 will be described with reference to FIG. 8. FIG. 8 is a schematic view illustrating an example of the hardware configuration of the support device 300 that is applied to the PLC system 1 according to this embodiment. Referring to FIG. 8, the support device 300, typically, is configured by a general computer. In addition, on a manufacturing site in which the PLC system 1 is disposed, the support device 300 may be provided in the form of a laptop personal computer having superior portability.

The support device 300 includes a CPU 302 that executes various programs including an operating system (OS), a read only memory (ROM) 304 that stores a BIOS and various kinds of data, a memory RAM 306 that provides a work area used for storing data, which is necessary for executing a program in the CPU 302, and a hard disk (HDD) 308 that stores a program and the like executed by the CPU 302 in a nonvolatile manner. In addition, the support device 300 includes a keyboard 310 and a mouse 312 that receive operations from a user and a display 314 that is used for presenting information to the user. The support device 300 includes a communication interface 318 used for communicating with the CPU unit 10, the power supply unit 100, and the like. The support device 300 includes a recording media reading device 317 that is used for reading a support program from a recording medium 350 stored therein.

A user can change the setting of the adjustment time T2 using input units such as the keyboard 310, the mouse 312, and the like of the support device 300. As described above, when the threshold voltage Vs is lowered, the adjustment time T2s also needs to be shortened. An example of calculation equations for calculating values of the threshold voltage Vn and the adjustment time T2 will be described below.

First, in a case in which a part of the input voltage is charged into the capacitor 27, a time Tm in which the charged voltage is discharged can be acquired using the following equations.

$$Tm = (1/2) \times C \times V^2 / P$$

Here, C: Capacitance of the capacitor 27, V: Voltage of the capacitor 27, and P: Power consumption of a device including the CPU unit 10 connected to the output terminal 32.

In the equation described above, when a voltage for which the power consumption P and energy charged into the capacitor 27 are the same is denoted by $V_0$, the following equation is satisfied.

$$P = (1/2) \times C \times V_0^2$$

When a time (maintaining time) in which power consumption can be maintained using the charged energy of the capacitor 27 is denoted by Th, the following Equation (1) is satisfied. From Equation (1), for example, it can be understood that the maintaining time is shortened by about 20% when the voltage V of the capacitor is reduced by 10% (0.9×0.9=0.81).

$$Th = (1/2) \times C \times (V^2 - V_0^2) / P \tag{1}$$

In addition, a maximum value Imax of a current flowing through the primary winding 22p is set in advance. For this reason, the flowing equation is satisfied from $V_0 = P/Imax$.

$$Th = (1/2) \times C \times (V^2/P - P/I\max^2)$$

In a case in which the threshold voltage Vn and the adjustment time T2 are set to Vs and Ts of the previous-time setting values from Equation (1), and a maintaining time Th based on these values is set to a standard maintaining time Ths based on the previous-time setting values, Equation (2) is satisfied.

$$Ths = (1/2) \times C \times (Vs^2/W\max - W\max/I\max^2) = T1 + T2s + T3 + T4 = T1 + T5s \tag{2}$$

Here, Wmax: Maximum rated power of the power supply unit 100, and Vs: Previous-time setting value of the threshold voltage Vn (the threshold voltage Vn before change).

Then, in a case in which the threshold voltage Vs is changed to the threshold voltage Va, and the maintaining time is set to the maintaining time Tha after change, the following equation is satisfied.

$$Tha = (1/2) \times C \times (Va^2/W_0 - W_0/I\max^2) \cdot \quad (3)$$

Here, in addition to the threshold voltage Va, for example, settings of a plurality of stages including Vb, Vc, and Vd and the threshold voltage Vs can be changed.

Figure 9:
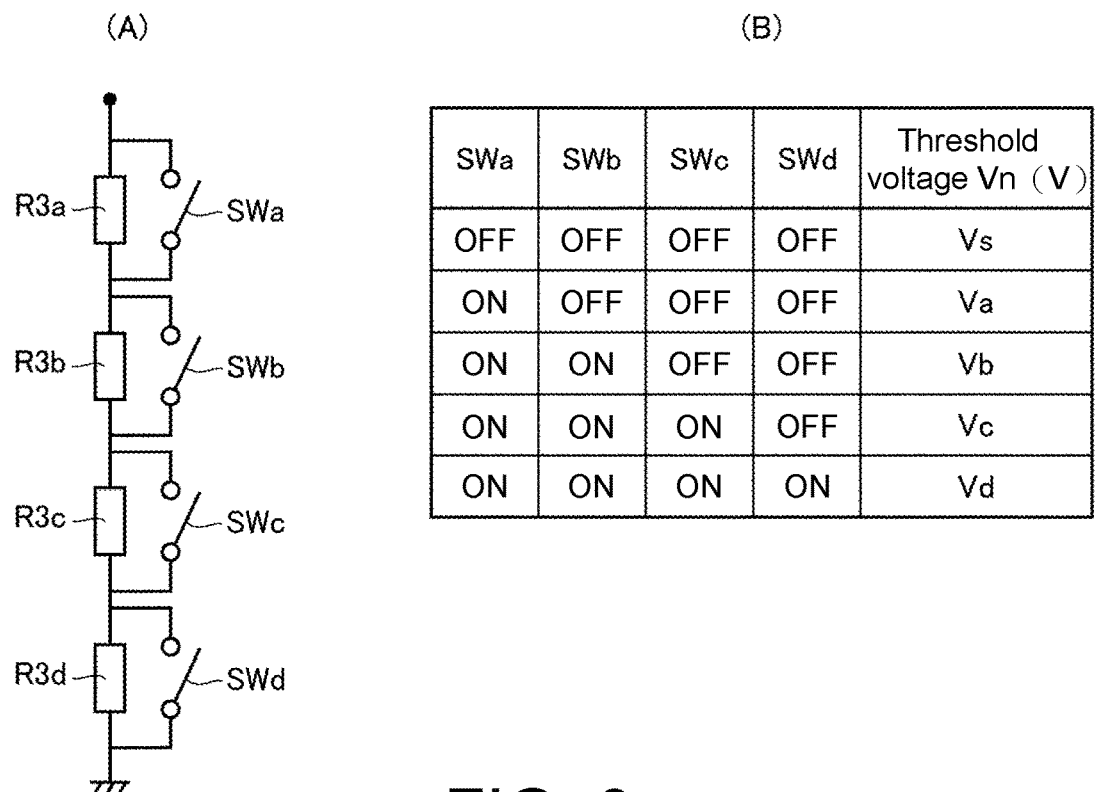
FIG. 9 is a diagram illustrating an example of change of a voltage setting of a threshold voltage Vn according to this embodiment.

An example of the setting will be described with reference to FIG. 9. FIG. 9 is a diagram illustrating an example of change of a voltage setting of the threshold voltage Vn according to this embodiment. Until now, a configuration in which one switch SW is connected to one resistor R3 in parallel has been described as an example. In contrast to this, a configuration in which switches (switches SWa, SWb, SWc, and SWd) are respectively disposed in a plurality of resistors (resistors R3a, R3b, R3c, and R3d) in parallel will be described with reference to part (A) of FIG. 9 as an example. On/off of such switches, for example, is switched by a user's operation on the changeover switch 26.

Part (B) of FIG. 9 illustrates changes in the threshold voltage Vn corresponding to on/off of the switches SWa to SWd. More specifically, in a case in which resistance values of the resistors R3a, Rb, Rc, and R3d are configured to be the same resistance values, when all the switches are off (the switches SWa, SWb, SWc, and SWd are off), a total resistance value of such resistors becomes a maximum. As a result, the threshold voltage becomes a largest threshold voltage (for example, Vs). As the number of switches that are set to on among the switches SWa, SWb, SWc, and SWd becomes larger, the threshold voltage decreases. When all the switches are on (the switches SWa, SWb, SWc, and SWd are on), a total resistance value of such resistors becomes a minimum. As a result, the threshold voltage becomes the threshold voltage Vd and becomes a threshold voltage lower than the other threshold voltages (for example, Va, Vb, and Vc). In addition, the changeover switch 26, for example, is a rotary switch, and, by switching the switch to one of numbers 0 to 9, the threshold voltage Vn can be set to one of a plurality of voltages. For example, the threshold voltage can be changed from a large voltage Vn to a low voltage (Vs>Va>Vb>Vc>Vd).

The values of the threshold voltage Vn and the adjustment time T2 are selected such that a condition represented in Equation (4) is satisfied based on Equation (2) and Equation (3).

$$Ths - Tha < T2 + T4 \quad (4)$$

The threshold voltage Vn and the adjustment time T2 are set such that a value acquired by subtracting the maintaining time Tha after change from the maintaining time Ths before change is smaller than a sum of the adjustment time T2 after change (for example, T2a) and the spare time T4. In this way, the threshold voltage Vn and the adjustment time T2 are associated with each other, and, in a case in which the setting of one thereof is changed, the setting of the other needs to be also changed in accordance with details of the change. As a method of changing the setting, for example, as described above, there is a method in which a user sets the threshold voltage Vn using the changeover switch 26 and changes the adjustment time T2 using the support device 300.

Other than those described above, for example, a user may change the threshold voltage Vn and the adjustment time T2 using the support device 300. In addition, by disposing a switch similar to the changeover switch 26 also on the surface of the CPU unit 10, a user may change the threshold voltage Vn and the adjustment time T2 by operating the changeover switch 26 disposed in the power supply unit 100 and the switch disposed in the CPU unit 10. Furthermore, it may be configured such that a user inputs a value after change of one of the threshold voltage Vn and the adjustment time T2 to the support device 300 using the input unit, the CPU 302 calculates a value after change of the other by executing an arithmetic operation process, and the settings of the threshold voltage Vn and the adjustment time T2 are changed based on the value input by the user and the calculated value.

Figure 10:
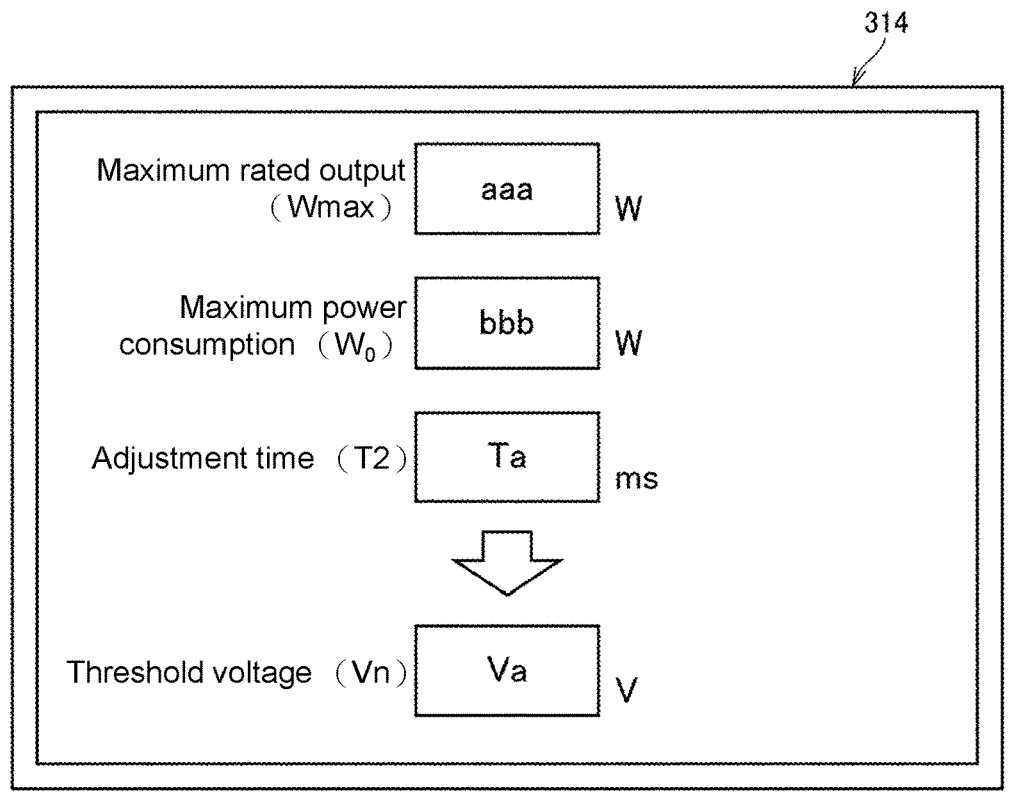
FIG. 10 is a diagram illustrating an example of an image displayed in a display in a case in which a support device according to this embodiment calculates a threshold voltage Vn.

An example of the method of changing the setting will be described with reference to FIG. 10. FIG. 10 is a diagram illustrating an example of an image displayed in the display 314 in a case in which the support device 300 according to this embodiment calculates a threshold voltage Vn. A user inputs a maximum rated output (Wmax) of the power supply unit 100, maximum power consumption ($W_0$) of the entire PLC system 1, and an adjustment time T2 by operating the input unit of the support device 300. The CPU 302 of the support device 300 calculates a threshold voltage Vn by performing an arithmetic operation process based on Equations (2), (3), and (4). The power consumption of the entire PLC system 1 is maximum power that is actually used by the CPU unit 10 and the I/O unit 200. In addition, the maximum rated output of the power supply unit 100 and the maximum power consumption of the entire PLC system 1 are calculated in advance by the support device 300 based on information acquired from the PLC system 1 and is notified to a user. The threshold voltage Vs that is a previous-time setting value in Equation (2) or Equation (3), a maximum value Imax of a current flowing through the primary winding 22p, and the capacitance C of the capacitor 27 are also calculated in advance by the support device 300. The CPU 302 of the support device 300 calculates a threshold voltage Vn (for example, the threshold voltage Va) from the value of the adjustment time T2 (for example, the adjustment time Ta) such that the relationship of Equation (4) is satisfied. The value of the threshold voltage Vn calculated in this way is displayed in the display 314. In this way, the PLC system 1 can display the threshold voltage in the display 314, and a change of the setting of the threshold voltage Vn can be received from a user who has checked the threshold voltage Vn displayed in the display 314. In addition, a user can change the setting of the threshold voltage Vn while checking the threshold voltage Vn displayed in the display 314.

Figure 11:
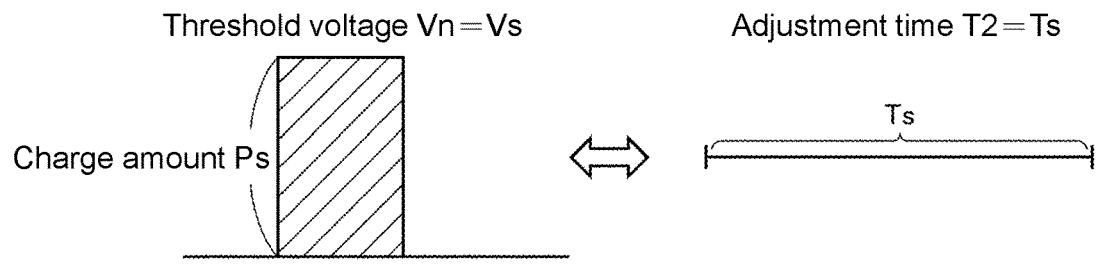
FIG. 11 illustrates a correspondence relation between a threshold voltage Vn, an amount of charging in a capacitor, and an adjustment time T2 according to this embodiment.
Figure 11:
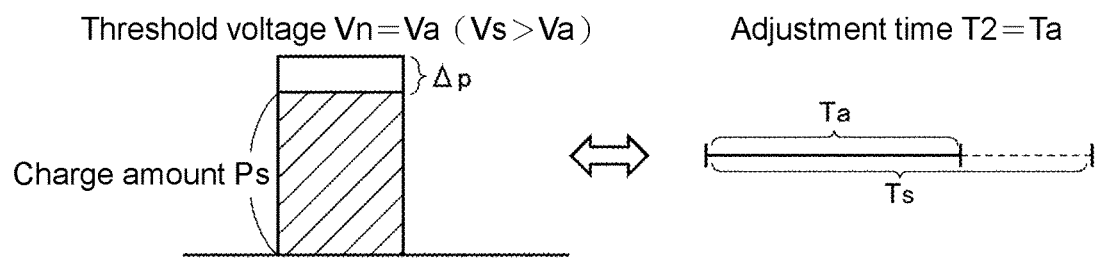

A relation between the adjustment time T2 and the threshold voltage Vn illustrated in FIG. 10 described above will be described with reference to FIG. 11. FIG. 11 illustrates a correspondence relation between the threshold voltage Vn, an amount of charging in the capacitor 27, and the adjustment time T2 according to this embodiment. In part (A) of FIG. 11, for example, in a case in which the threshold voltage Vn is set to the largest threshold voltage Vs, the amount of charging in the capacitor 27 becomes Ps. The adjustment time T2 for the amount of charging Ps becomes the adjustment time T2s. In contrast to this, in part (B) of FIG. 11, for example, in a case in which the threshold voltage Vn is set to a voltage Va lower than the threshold voltage Vs, the amount of charging in the capacitor 27 becomes Pa that is Δp smaller than Ps. As a result, the adjustment time T2 becomes Ta that is shorter than the adjustment time Ts. In this way, regarding the threshold voltage Vn, the amount of charging in the capacitor, and the adjustment time T2, when one of the threshold voltage Vn and the adjustment time T2 changes, the other also changes in accordance with the change. In this way, the PLC system 1 can set an optimal threshold voltage Vn based on the set adjustment time T2. In addition, the PLC system 1 can set an optimal adjustment time T2 based on the set threshold voltage Vn.

In addition, in addition to the change of the setting described until now, the CPU 302 of the support device 300 may calculate a threshold voltage Vn (for example, the threshold voltage Va) based on an adjustment time T2 (for example, the adjustment time T2a) input by a user's operation using the input unit. The support device 300 outputs a change instruction signal relating to the input adjustment time T2a to the CPU unit 10 through the communication interface 318. The processor 11 of the CPU unit 10 changes the adjustment time T2 of the setting information 154 to the adjustment time T2a based on the change instruction signal relating to the received adjustment time T2. In addition, the support device 300 outputs a change instruction signal relating to the threshold voltage Va to the power supply unit 100 through the communication interface 318. This change instruction signal may be output from the support device 300 to the power supply unit 100 through the CPU unit 10. The power supply unit 100 performs on/off switching of the switch SW based on the change instruction signal relating to the received threshold voltage Vn. In accordance with this, the threshold voltage Vn is changed. In addition, in a case in which a change instruction signal is output through the CPU unit 10, the on/off control of the switch SW may be performed such that, when the change instruction signal is received, the processor 11 may read setting information of the threshold voltage Vn from the storage 150 and execute the process of changing the threshold voltage Vn. The threshold voltage Vn is stored in the setting information 154 of the storage 150 of the CPU unit 10 in advance. In addition, by providing a processor and a storage in the power supply unit 100, the process may be executed by the processor.

In a case in which the adjustment time T2 is changed to a time that is shorter than a time that has been set at the previous time, the threshold voltage Vn is changed to a voltage lower than a voltage that has been set at the previous time. In addition, in a case in which the adjustment time T2 is changed to a time that is longer than a time that has been set at the previous time, the threshold voltage Vn is changed to a voltage higher than a voltage that has been set at the previous time. In this way, the PLC system 1 can change the threshold voltage Vn in association with a change in the time T2 of the second timer 117, and user convenience at the time of changing the setting is improved.

More specifically, by changing the adjustment time T2 to a time (for example, the adjustment time T2a) shorter than the adjustment time T2s that is the setting value of the previous time, a time in which the CPU unit 10 can operate after stop of the supply of power becomes shorter than that for the adjustment time T2 before change. However, by changing the threshold voltage Vn to a voltage (for example, the threshold voltage Va) lower than Vs that has been set at the previous time, a frequency at which stop of supply of power is determined decreases. In this way, the operation rate of the PLC system 1 is improved. In a case in which the adjustment time T2 is changed from the adjustment time T2a that has been set at the previous time to another time (for example, the adjustment time T2s) (T2a<T2s), the adjustment time becomes longer than that before change, and thus, a voltage to be charged into the capacitor needs to be a voltage higher than that before change. For this reason, in a case in which the threshold voltage that has been set at the previous time is Va, the threshold voltage Vn is changed to a voltage higher than that (for example, the threshold voltage Vs). In this way, the adjustment time T2 and the threshold voltage Vn of the PLC system 1 are changed in association with each other. In this way, the PLC system 1 can adjust a frequency at which stop of the supply of power is determined in accordance with the form of the system, and a necessary process after the determination of stop of the supply of power can be reliably executed.

In addition, the CPU 302 of the support device 300 may calculate an adjustment time T2 (for example, the adjustment time T2a) based on a threshold voltage (for example, the threshold voltage Va) input from the input unit by a user. The support device 300 outputs a change instruction signal relating to the input threshold voltage Va to the power supply unit 100 through the communication interface 318. This change instruction signal may be output from the support device 300 to the power supply unit 100 through the CPU unit 10. The power supply unit 100 performs on/off switching of the switch SW based on the change instruction signal relating to the received threshold voltage Vn, whereby the threshold voltage Vn is changed. In addition, in a case in which a change instruction signal is output through the CPU unit 10, similar to the description presented above, on/off control of the switch SW may be performed such that, when the change instruction signal is received, the processor 11 reads setting information of the threshold voltage Vn from the storage 150 and execute the process of changing the threshold voltage Vn. The threshold voltage Vn is stored in the setting information 154 of the storage 150 the CPU unit 10 in advance. In addition, a processor and a storage may be provided in the power supply unit 100, and the process may be executed by the processor. The support device 300 outputs the change instruction signal relating to the adjustment time T2a to the CPU unit 10 through the communication interface 318. The processor 11 of the CPU unit 10 changes the adjustment time T2 of the setting information 154 to the adjustment time T2a based on received the change instruction signal relating to the adjustment time T2.

Then, in a case in which the threshold voltage Vn is changed to a voltage lower than the voltage that has been set at the previous time, the adjustment time T2 is changed to a time shorter than that set at the previous time. In addition, in a case in which the threshold voltage Vn is changed to a voltage higher than the voltage that has been set at the previous time, the adjustment time T2 is changed to a time longer than that set at the previous time. In this way, the PLC system 1 can change the time T2 of the second timer 117 in association with a change of the threshold voltage Vn, and user's convenience at the time of performing a setting change is improved.

More specifically, by changing the threshold voltage Vn to a voltage (for example, the threshold voltage Va) lower than the setting value Vs of the previous time, a voltage charged into the capacitor 27 becomes lower than that at the time of the setting value Vs of the previous time. The operation time of the CPU unit 10 in a case in which the supply of power stops is shortened than that before the change of the threshold voltage Vn. For this reason, the adjustment time T2 is changed to a time (for example, the adjustment time T2a) that is shorter than the setting value T2s of the previous time. In a case in which the threshold voltage Vn is changed from Va that has been set at the previous time to another value (for example, the threshold voltage Vs) (Va<Vs), the voltage charged into the capacitor 27 becomes higher than that before the change. The operation time of the CPU unit 10 in a case in which the supply of power stops becomes longer than that before the change of the threshold voltage Vn. The adjustment time T2 is changed to a time (for example, the adjustment time T2s) that is longer than the adjustment time T2a that has been set at the previous time. In this way, the threshold voltage Vn and the adjustment time T2 of the PLC system 1 are changed in association with each other. In this way, the PLC system 1 can adjust a frequency at which the supply of power is determined to have stopped in accordance with the form of the system, and a necessary process after the determination of stop of the supply of power can be reliably executed.

<Modified Example>

In this embodiment, for example, in FIG. 5, while an example of the configuration in which necessary functions are provided by the processor 11 executing programs is illustrated, some or all of such provided functions may be implemented using a dedicated hardware circuit (for example, an ASIC, an FPGA, or the like). Alternatively, a main part of the CPU unit 10 may be realized using hardware (for example, an industrial PC based on a general computer) following a general architecture. In such a case, by using a virtualization technology, a plurality of operating systems (OS) having different purposes may be executed in parallel, and a necessary application may be executed on each OS. In this embodiment, in the PLC system 1 illustrated in FIG. 5, although the CPU unit 10 and the support device 300 are configured as separate bodies, a configuration in which all or some of functions of those are integrated in a single device may be employed.

In this embodiment, for example, although detection timings of the instantaneous stop detection signal SN1, the power interruption detection signal SN2, and the power supply detection signal SN3 illustrated in FIGS. 6 and 7 and a CPU reset signal RS are set as switching timings from a low signal→a high signal, switching timings from a high signal→a low signal may be used.

In this embodiment, for example, the timing diagrams illustrated in FIGS. 6 and 7 are displayed on the display 314 of the support device 300, and a user may set the threshold voltage Vn and the adjustment time T2 by operating the changeover switch 26 while checking transitions of parameters such as the AC input voltage and the like in a time series.

<Supplementary Note>

An embodiment of the present disclosure includes disclosures as below.

[Configuration 1]

A control system (1) including: a calculation unit (10) configured to execute an arithmetic operation process; and a power supply unit (100) configured to supply power to the calculation unit (10), the power supply unit (100) includes: a power converting unit (201) configured to use a part of an input power input from the outside for charging and convert a remainder of the input power into power supplied to the calculation unit (10); and a first detection unit (127) configured to compare a voltage of the input power with a threshold voltage and output a notification signal for notifying that predetermined power supply is not able to be performed in a case in which a time, over which a magnitude of the voltage has been lower than the threshold voltage, is detected to be over a first measurement time set in advance, the first detection unit (127) being configured to be able to change a setting of the threshold voltage by an external operation, and the calculation unit (10) includes: a second detection unit (117) configured to output an instruction signal for an instruction for execution of pre-stop processing in preparation for stopping of the predetermined power supply in a case in which it is detected that a second measurement time set in advance has elapsed after receiving the notification signal; and a processing execution management unit (111) configured to continue execution of the arithmetic operation process during the second measurement time and execute the pre-stop processing in place of the arithmetic operation process that is currently being executed after receiving the instruction signal, the second detection unit (117) being configured to be able to change a setting of the second measurement time by an external operation.

[Configuration 2]

The control system described in Configuration 1, further including a third detection unit (118) configured to output a stop instruction signal in a case in which a third measurement time for ending the arithmetic operation process using the calculation unit (10) has elapsed.

[Configuration 3]

The control system described in Configuration 1 or 2, a switch that is able to change the setting of the threshold voltage by the external operation is disposed on a surface of the power supply unit (100).

[Configuration 4]

The control system described in one of Configuration 1 to 3, in the first detection unit (127), the threshold voltage is changed to a voltage lower than a voltage that has been set at a previous time in a case in which the second measurement time is changed to a time shorter than a time that has been set at a previous time, and the threshold voltage is changed to a voltage higher than a voltage that has been set at the previous time in a case in which the second measurement time is changed to a time longer than a time that has been set at the previous time.

[Configuration 5]

The control system described in any one of Configuration 1 to 3, in the second detection unit (117), the second measurement time is changed to a time shorter than a time that has been set at the previous time in a case in which the threshold voltage is changed to a voltage lower than a voltage that has been set at a previous time, and the second measurement time is changed to a time longer than a time that has been set at a previous time in a case in which the threshold voltage is changed to a voltage higher than a voltage that has been set at the previous time.

[Configuration 6]

The control system according to any one of Configuration 1 to 5, further including a support device (300) configured to be electrically connected to the calculation unit (10), and the support device (300) includes: a calculation part (302) configured to calculate the threshold voltage corresponding to the second measurement time; and a display part (314) configured to display information relating to the threshold voltage.

[Configuration 7]

A power supply unit (100) that supplies power to a calculation unit (10) executing an arithmetic operation process, the power supply unit including: a power converting unit (201) configured to use a part of an input power input from the outside for charging and convert a remainder of the input power into power supplied to the calculation unit (10); and a first detection unit (127) configured to compare a voltage of the input power with a threshold voltage and output a notification signal for notifying that predetermined power supply is not able to be performed in a case in which a time, over which a magnitude of the voltage has been lower than the threshold voltage, is detected to be over a first measurement time set in advance, the calculation unit (10) is configured to receive the notification signal from the first detection unit (100), issue an execution signal for executing pre-stop processing in preparation for stopping of the predetermined power supply when a second measurement time set in advance has elapsed, continue to execute the arithmetic operation process during the second measurement time, execute the pre-stop processing in place of the arithmetic operation process that is currently being executed after the execution signal is received, and be able to change the setting of the second measurement time by an external operation, and the first detection unit (127) is configured to be able to change the setting of the threshold voltage by an external operation.

The embodiment disclosed here is an example in every aspect and should be considered as not being limited. The scope of the present disclosure is represented not by the description presented above but by claims, and all the changes made within the meaning and the range equivalent to the claims are intended to be included therein.

What is claimed is:

1. A control system comprising:
   a calculation unit that executes an arithmetic operation process; and
   a power supply unit that supplies power to the calculation unit,
   wherein the power supply unit includes:
   a power converting unit that charges a part of an input power input from an outside and converts a remainder of the input power into the power supplied to the calculation unit; and
   a first detection unit that compares a voltage of the input power with a threshold voltage and outputs a notification signal for notifying that predetermined power supply is not able to be performed in a case in which a time, over which a magnitude of the voltage has been lower than the threshold voltage, is detected to be over a first measurement time set in advance,
   the first detection unit is able to change a setting of the threshold voltage by an external operation, and
   wherein the calculation unit includes:
   a second detection unit that outputs an instruction signal for instructing an execution of pre-stop processing in preparation for stopping of the predetermined power supply in a case in which it is detected that a second measurement time set in advance has elapsed after receiving the notification signal; and
   a processing execution management unit that continues execution of the arithmetic operation process during the second measurement time and executes the pre-stop processing in place of the arithmetic operation process that is currently being executed after receiving the instruction signal,
   the second detection unit is able to change a setting of the second measurement time by an external operation.

2. The control system according to claim 1, further comprising a third detection unit that outputs a stop instruction signal in a case in which a third measurement time for ending the arithmetic operation process made by the calculation unit has elapsed.

3. The control system according to claim 2, wherein a switch that is able to change the setting of the threshold voltage by the external operation is disposed on a surface of the power supply unit.

4. The control system according to claim 2, wherein, in the first detection unit, the threshold voltage is changed to a voltage lower than a voltage that has been set at a previous time in a case in which the second measurement time is changed to a time shorter than a time that has been set at the previous time, and the threshold voltage is changed to a voltage higher than a voltage that has been set at a previous time in a case in which the second measurement time is changed to a time longer than a time that has been set at the previous time.

5. The control system according to claim 2, wherein, in the second detection unit, the second measurement time is changed to a time shorter than a time that has been set at a previous time in a case in which the threshold voltage is changed to a voltage lower than a voltage that has been set at the previous time, and the second measurement time is changed to a time longer than a time that has been set at a previous time in a case in which the threshold voltage is changed to a voltage higher than a voltage that has been set at the previous time.

6. The control system according to claim 2, further comprising a support device that is electrically connected to the calculation unit,
   wherein the support device includes:
   a calculation part that calculates the threshold voltage corresponding to the second measurement time; and
   a display part that displays information relating to the threshold voltage.

7. The control system according to claim 1, wherein a switch that is able to change the setting of the threshold voltage by the external operation is disposed on a surface of the power supply unit.

8. The control system according to claim 7, wherein, in the first detection unit, the threshold voltage is changed to a voltage lower than a voltage that has been set at a previous time in a case in which the second measurement time is changed to a time shorter than a time that has been set at the previous time, and the threshold voltage is changed to a voltage higher than a voltage that has been set at a previous time in a case in which the second measurement time is changed to a time longer than a time that has been set at the previous time.

9. The control system according to claim 7, wherein, in the second detection unit, the second measurement time is changed to a time shorter than a time that has been set at a previous time in a case in which the threshold voltage is changed to a voltage lower than a voltage that has been set at the previous time, and the second measurement time is changed to a time longer than a time that has been set at a previous time in a case in which the threshold voltage is changed to a voltage higher than a voltage that has been set at the previous time.

10. The control system according to claim 7, further comprising a support device that is electrically connected to the calculation unit,
    wherein the support device includes:
    a calculation part that calculates the threshold voltage corresponding to the second measurement time; and
    a display part that displays information relating to the threshold voltage.

11. The control system according to claim 1, wherein, in the first detection unit, the threshold voltage is changed to a voltage lower than a voltage that has been set at a previous time in a case in which the second measurement time is changed to a time shorter than a time that has been set at the previous time, and the threshold voltage is changed to a voltage higher than a voltage that has been set at a previous time in a case in which the second measurement time is changed to a time longer than a time that has been set at the previous time.

12. The control system according to claim 1, wherein, in the second detection unit, the second measurement time is changed to a time shorter than a time that has been set at a previous time in a case in which the threshold voltage is changed to a voltage lower than a voltage that has been set at the previous time, and the second measurement time is changed to a time longer than a time that has been set at a previous time in a case in which the threshold voltage is changed to a voltage higher than a voltage that has been set at the previous time.

13. The control system according to claim 1, further comprising a support device that is electrically connected to the calculation unit,
   wherein the support device includes:
   a calculation part that calculates the threshold voltage corresponding to the second measurement time; and
   a display part that displays information relating to the threshold voltage.

14. A power supply unit that supplies power to a calculation unit executing an arithmetic operation process, the power supply unit comprising:
   a power converting unit that charges a part of an input power input from an outside and converts a remainder of the input power into power supplied to the calculation unit; and
   a first detection unit that compares a voltage of the input power with a threshold voltage and outputs a notification signal for notifying that predetermined power supply is not able to be performed in a case in which a time, over which a magnitude of the voltage has been lower than the threshold voltage, is detected to be over a first measurement time set in advance,
   wherein the calculation unit receives the notification signal from the first detection unit, issues an execution signal for executing pre-stop processing in preparation for stopping of the predetermined power supply when a second measurement time set in advance has elapsed, continues to execute the arithmetic operation process during the second measurement time, executes the pre-stop processing in place of the arithmetic operation process that is currently being executed after the execution signal is received, and is able to change the setting of the second measurement time by an external operation, and
   wherein the first detection unit is able to change a setting of the threshold voltage by an external operation.

* * * * *